(12) United States Patent
Pang et al.

(10) Patent No.: US 12,707,863 B2
(45) Date of Patent: Aug. 11, 2026

(54) ELECTROLUMINESCENT DISPLAY DEVICE

(71) Applicant: LG Display Co., Ltd., Seoul (KR)

(72) Inventors: HeeSuk Pang, Paju-si (KR); Jaeho Choi, Gyeongju-si (KR)

(73) Assignee: LG Display Co., Ltd., Seoul (KR)

( * ) Notice: Subject to any disclaimer, the term of this patent is extended or adjusted under 35 U.S.C. 154(b) by 414 days.

(21) Appl. No.: 18/467,485

(22) Filed: Sep. 14, 2023

(65) Prior Publication Data

US 2024/0099107 A1 Mar. 21, 2024

(30) Foreign Application Priority Data

Sep. 21, 2022 (KR) ........................ 10-2022-0119156

(51) Int. Cl.
*H10K 59/80* (2023.01)
*H10K 50/844* (2023.01)
*H10K 102/00* (2023.01)

(52) U.S. Cl.
CPC ......... *H10K 59/873* (2023.02); *H10K 59/874* (2023.02); *H10K 2102/341* (2023.02)

(58) Field of Classification Search
CPC ........................... H10K 59/873; H10K 59/844
See application file for complete search history.

(56) References Cited

U.S. PATENT DOCUMENTS 9,406,732 B2 8/2016 Paek et al.
2014/0008625 A1* 1/2014 Hiraoka ................ H05B 33/10 438/26
2014/0217394 A1 8/2014 Kin et al.
2020/0152906 A1* 5/2020 Kirita ..................... H10K 71/00
2023/0157085 A1* 5/2023 Kim ....................... G09G 3/006 345/204

FOREIGN PATENT DOCUMENTS

JP 2000040585 A 2/2000
JP 2001307873 A 11/2001
JP 2004362912 A 12/2004
JP 2007066656 A 3/2007
JP 2007073504 A 3/2007
JP 2012528441 A 11/2012
JP 2013187191 A 9/2013
JP 2015037083 A 2/2015
JP 5805181 B2 11/2015
JP 2016039078 A * 3/2016 ........... H10K 50/844
JP 2017102386 A 6/2017
JP 2019102423 A 6/2019
JP 2022070849 A 5/2022

(Continued)

*Primary Examiner* — Joseph L Williams
(74) *Attorney, Agent, or Firm* — Seed Intellectual Property Law Group LLP

(57) ABSTRACT

An electroluminescent display device according to an exemplary embodiment of the present disclosure includes an anode over a substrate, an organic layer on the anode, a cathode on the organic layer, an encapsulation layer over the cathode, a foreign material present between the anode and the organic layer, the cathode, and the encapsulation layer and a barrier layer over the encapsulation layer to cover the foreign material, so that penetration of moisture and oxygen is prevented and thus, dark spot defects and pixel defects caused by foreign substances can be repaired.

37 Claims, 15 Drawing Sheets

(56) References Cited

FOREIGN PATENT DOCUMENTS

| | | | | |
|---|---|---|---|---|
| KR | 10-2014-0082957 A | | 7/2014 | |
| KR | 20160005174 A | | 1/2016 | |
| KR | 20190069196 A | | 6/2019 | |
| KR | 102317393 B1 | * | 10/2021 | ........... H10K 59/124 |
| KR | 10-2022-0056107 A | | 5/2022 | |
| WO | WO 2013051071 A1 | | 4/2013 | |
| WO | WO 2014208435 A1 | | 12/2014 | |
| WO | WO 2016166958 A1 | | 10/2016 | |

* cited by examiner

ELECTROLUMINESCENT DISPLAY DEVICE

CROSS-REFERENCE TO RELATED APPLICATIONS

This application claims the benefit of and priority to Korean Patent Application No. 10-2022-0119156 filed on Sep. 21, 2022, in the Republic of Korea, the entire contents of which are hereby expressly incorporated by reference into the present application.

BACKGROUND

Technical Field

The present disclosure relates to an electroluminescent display device, and more particularly, to an electroluminescent display device of a bottom emission type.

Description of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Representative display devices include a liquid crystal display device (LCD), an electro-wetting display device (EWD), and an organic light emitting display device (OLED).

Among the display devices, an electroluminescent display device including the organic light emitting display device is a self-luminous display device and can be manufactured to be light and thin since it does not require a separate light source, unlike the liquid crystal display device having a separate light source. In addition, the electroluminescent display device has advantages in terms of power consumption due to a low voltage driving, and is excellent in terms of a color implementation, a response speed, a viewing angle, and a contrast ratio (CR). Therefore, electroluminescent display devices have been expected to be used in various application fields.

BRIEF SUMMARY

An aspect of the present disclosure is to provide an electroluminescent display device capable of preventing defects caused by foreign materials.

Another aspect of the present disclosure is to provide an electroluminescent display device capable of preventing penetration of external moisture and oxygen.

Still another aspect of the present disclosure is to provide an electroluminescent display capable of shielding electromagnetic interference.

Still another aspect of the present disclosure is to provide an electroluminescent display device in which rigidity of a display panel is increased and a heat dissipation effect is improved.

The technical benefits of the present disclosure are not limited to the above-mentioned benefits, and other benefits, which are not mentioned above, can be clearly understood by those skilled in the art from the following descriptions.

An electroluminescent display device according to an exemplary embodiment of the present disclosure may include an anode over a substrate, an organic layer on the anode, a cathode on the organic layer, an encapsulation layer over the cathode, a foreign material present between the anode and the organic layer, the cathode, and the encapsulation layer and a barrier layer over the encapsulation layer to cover the foreign material.

Other detailed matters of the exemplary embodiments are included in the detailed description and the drawings.

According to the present disclosure, dark spot defects and pixel defects caused by a foreign material can be repaired by covering a large foreign material with a plurality of barrier layers to prevent penetration of moisture and oxygen.

According to the present disclosure, penetration of moisture and oxygen can be effectively prevented by applying an additional encapsulation substrate to an upper portion of the plurality of barrier layers, thereby improving reliability of moisture permeation prevention performance.

According to the present disclosure, reliability of an electroluminescent display device can be improved by shielding electromagnetic interference through connecting an upper encapsulation substrate or a reinforcing substrate to a low potential voltage.

According to the present disclosure, by introducing an encapsulation structure of a multilayer structure including a relatively thick reinforcing substrate, rigidity and heat dissipation effects can be sufficiently secured. In addition, by filling and covering the trench pattern with a step reduction layer (or a gap-filling layer), the adhesion of the encapsulation structure in a multilayer structure can be improved, and the durability of the electroluminescent display device can be enhanced.

The effects according to the present disclosure are not limited to the contents exemplified above, and more various effects are included in the present specification.

DETAILED DESCRIPTION

Figure 1:
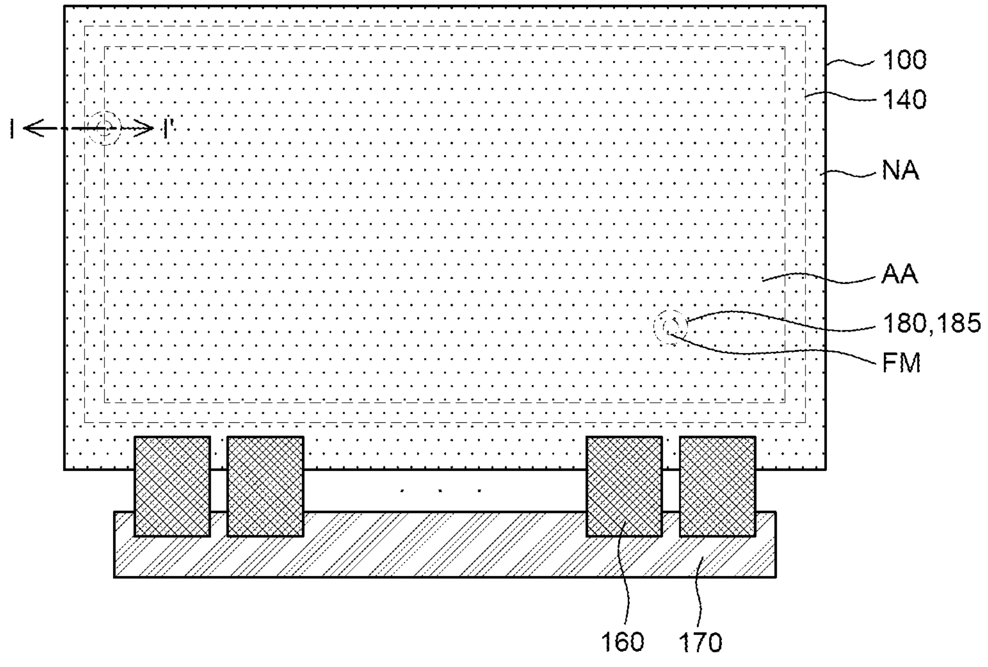
FIG. 1 is a plan view schematically illustrating an electroluminescent display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, numbers, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to the accompanying drawings.

FIG. 1 is a plan view schematically illustrating an electroluminescent display device according to a first exemplary embodiment of the present disclosure.

In FIG. 1, a case in which a foreign material FM is generated at an arbitrary point of a display panel 100 is illustrated as an example. However, the present disclosure is not limited to presence or absence of the foreign material FM and the number and occurrence points of foreign materials FM. A foreign material FM may include any external unwanted materials such as debris, particles, or any type of impurities, or the like. The examples of foreign materials FM are not limited to the above-mentioned examples and may include any type of materials that can cause the pixels to become dead pixels.

Referring to FIG. 1, the electroluminescent display device according to the first exemplary embodiment of the present disclosure may include the display panel 100, flexible films 160, a printed circuit board 170, and an encapsulation substrate 140.

The display panel 100 is a panel for displaying an image to a user.

The display panel 100 may include display elements for displaying an image, driving elements for driving the display elements, and lines for transmitting various signals to the display elements and the driving elements. The display elements may be defined differently depending on a type of the display panel 100. For example, when the display panel 100 is an organic light emitting display panel, the display element is an organic light emitting element including an anode, an organic light emitting layer, and a cathode. For example, when the display panel 100 is a liquid crystal display panel, the display element may be a liquid crystal display element.

Hereinafter, it is described assuming that the display panel 100 is an organic light emitting display panel, but the display panel 100 is not limited to the organic light emitting display panel.

The display panel 100 may include an active area AA and a non-active area NA.

The active area AA is an area in which an image is displayed on the display panel 100.

A plurality of sub-pixels constituting a plurality of pixels and a circuit for driving the plurality of sub-pixels may be disposed in the active area AA. The plurality of sub-pixels are minimum units constituting the active area AA, and the display element may be disposed in each of the plurality of sub-pixels, and the plurality of sub-pixels may constitute the pixel. For example, an organic light emitting element including an anode, an organic light emitting layer, and a cathode may be disposed in each of the plurality of sub-pixels, but is not limited thereto. In addition, the circuit for driving the plurality of sub-pixels may include a driving element, lines and the like. For example, the circuit may be formed of a thin film transistor, a storage capacitor, a gate line, a data line, and the like, but is not limited thereto.

The non-active area NA is an area in which an image is not displayed.

FIG. 1 illustrates that the non-active area NA surrounds the active area AA having a quadrangular shape, but shapes and arrangements of the active area AA and the non-active area NA are limited to the example illustrated in FIG. 1.

In other words, shapes of the active area AA and the non-active area NA may be suitable for a design of an electronic device on which the electroluminescent display device is mounted. For example, other exemplary shapes of the active area AA may be a pentagon, a hexagon, a circle, an oval, and the like.

Various lines and circuits for driving organic light emitting elements of the active area AA may be disposed in the non-active area NA. For example, in the non-active area NA, link lines for transmitting signals to the plurality of sub-pixels and circuits of the active area AA or driver ICs such as a gate driver IC and a data driver IC may be disposed, but are not limited thereto.

The electroluminescent display device may include various additional elements for generating various signals or driving pixels in the active area AA. The additional elements for driving the pixels may include an inverter circuit, a multiplexer, an electro-static discharge (ESD) circuit, and the like. The electroluminescent display device may also include additional elements associated with functions other than driving pixels. For example, the electroluminescent display device may include additional elements that provide a touch sensing function, a user authentication function (e.g., fingerprint recognition), a multi-level pressure sensing function, a tactile feedback function, and the like. Such additional elements may be located in the non-active area NA and/or in an external circuit connected to a connection interface.

The flexible film 160 is a film in which various components are disposed on a flexible base film. Specifically, the flexible films 160 are films for supplying signals to the plurality of sub-pixels and circuits of the active area AA, and may be electrically connected to the display panel 100. The flexible films 160 may be disposed at one end of the non-active area NA of the display panel 100 and supply a power voltage, a data voltage and the like to the plurality of sub-pixels and circuits of the active area AA. Meanwhile, the number of flexible films 100 may be variously changed according to design, but is not limited thereto.

Meanwhile, a driver IC such as a data driver IC may be disposed on the flexible films 160. The driver IC is a component that processes a data signal for displaying an image and a driving signal for processing it. The driver IC may be disposed in a manner such as a chip-on-glass (COG), chip-on-film (COF), or tape carrier package (TCP) according to a mounting method.

The printed circuit board 170 may be disposed at one ends of the flexible films 160 and connected to the flexible films 160. The printed circuit board 170 is a component that supplies signals to the driver IC. The printed circuit board 170 may supply various signals such as a driving signal and a data signal to the driver IC. For example, a data driver generating data signals may be mounted on the printed circuit board 170, and the generated data signals may be supplied to the plurality of sub-pixels and circuits of the display panel 100 through the flexible films 160. The number of printed circuit boards 170 may be variously changed according to design, but is not limited thereto.

The electroluminescent display device may be implemented in a top emission method or bottom emission method, and the present disclosure may be applied to the bottom emission method, but is not limited thereto.

Meanwhile, a foreign material FM may be generated during a manufacturing process of the electroluminescent display device, and particularly, in the case of a large foreign material FM, an encapsulation layer may not completely cover the foreign material FM. In addition, in the case of the encapsulation substrate 140, moisture and oxygen may be permeated from the outside through a pin-hole. In these cases, dark spots and fade-out of the pixels may occur.

Accordingly, the present disclosure is characterized in that a plurality of barrier layers 180 and 185 are applied to a point where a large foreign material FM is generated to cover the foreign material FM and block oxygen and moisture, thereby allowing for repair of dark spot defects and pixels defects caused by the foreign material FM. A more detailed description thereof will be described with reference to FIGS. 2 and 3.

Figure 2:
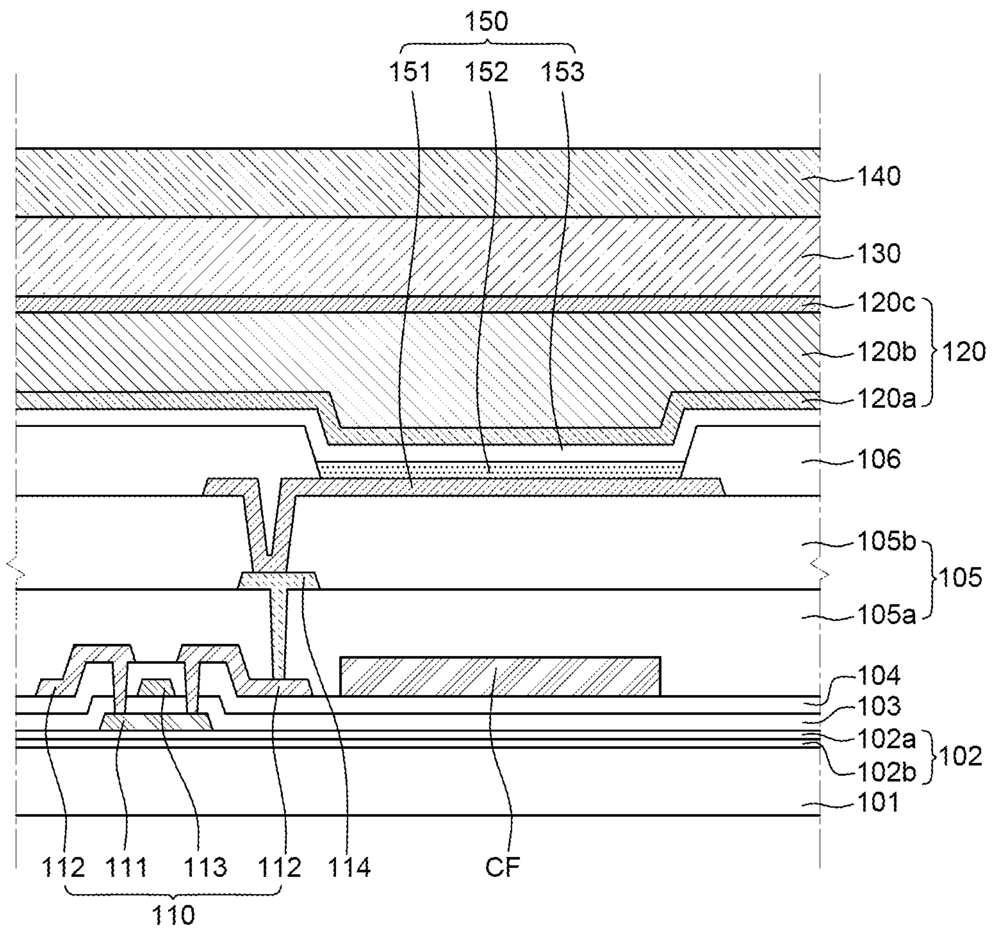
FIG. 2 is a cross-sectional view illustrating a sub-pixel of the electroluminescent display according to the first exemplary embodiment of the present disclosure.

FIG. 2 is a cross-sectional view illustrating a sub-pixel of the electroluminescent display according to the first exemplary embodiment of the present disclosure.

Figure 3:
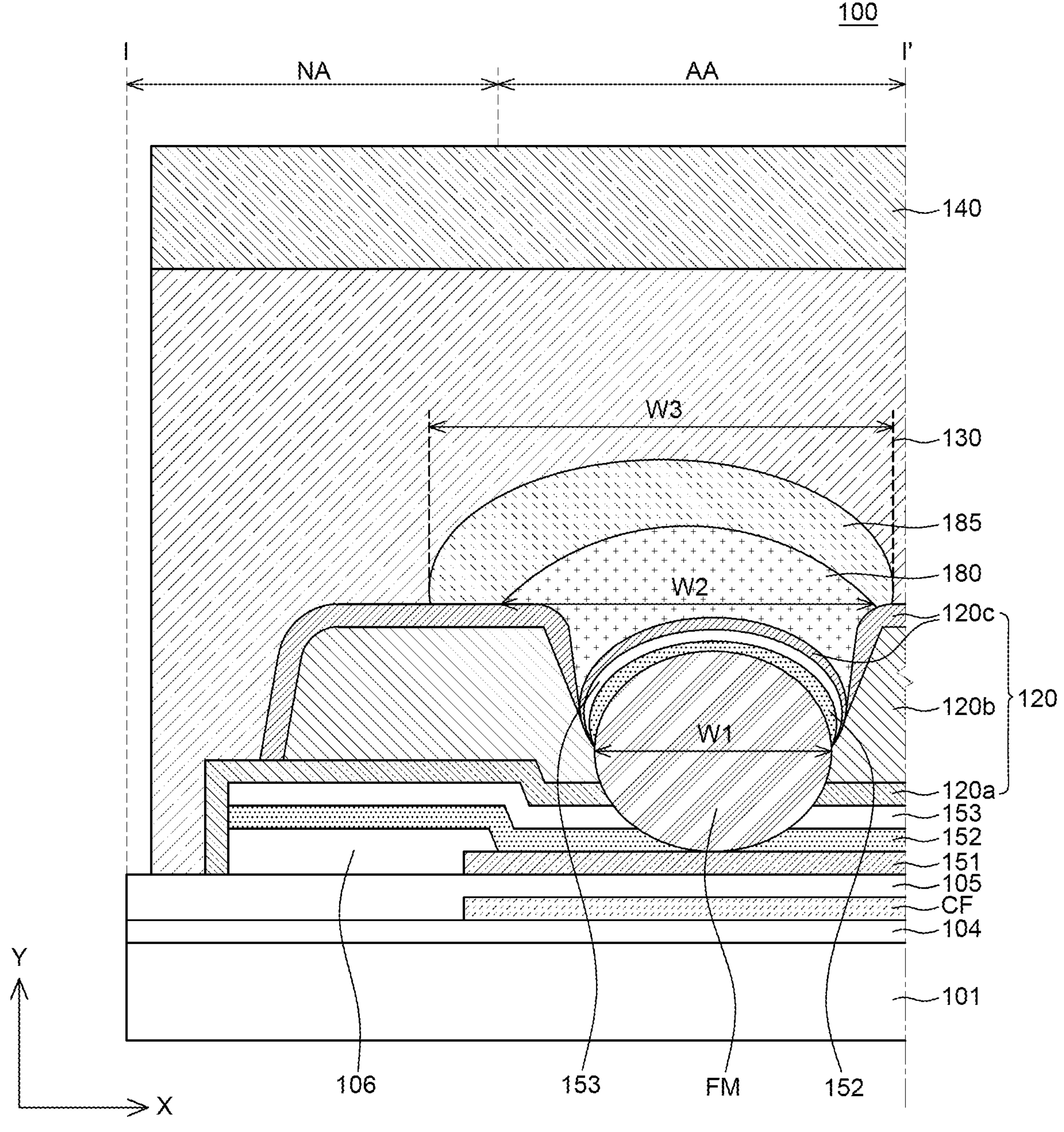
FIG. 3 is a cross-sectional view taken along I-I' of FIG. 1.

FIG. 3 is a cross-sectional view taken along I-I' of FIG. 1.

FIG. 2 is a cross-sectional view of one sub-pixel in the display panel 100 according to the first exemplary embodiment of the present disclosure. FIG. 3 illustrates a cross-section of a left side of the display panel 100 where the foreign material FM is generated. In FIG. 3, detailed illustrations of a pixel unit of the active area AA and a GIP unit of the non-active area NA is omitted for convenience of description.

Referring to FIGS. 2 and 3, in the display panel 100 according to the first exemplary embodiment of the present disclosure, a driving element 110 may be disposed on a substrate 101.

In addition, a planarization layer 105 may be disposed on the driving element 110.

In addition, an organic light emitting element 150 that is electrically connected to the driving element 110 is disposed on the planarization layer 105, and an encapsulation layer 120 formed of multiple layers is disposed on the organic light emitting element 150 so that penetration of oxygen and moisture into the organic light emitting element 150 can be reduced or minimized.

The encapsulation substrate 140 may be disposed over the encapsulation layer 120 with an adhesive layer 130 interposed therebetween, but the present disclosure is not limited thereto, and a sealing member and a reinforcing substrate may be sequentially disposed on the encapsulation layer 120.

As described above, the display panel 100 according to the first exemplary embodiment of the present disclosure is not limited to such a laminated structure.

Specifically, the substrate 101 may be a glass or plastic substrate. When the substrate 101 is a plastic substrate, a polyimide-based or polycarbonate-based material may be used to have flexibility. In particular, polyimide can be applied to a high-temperature process and is widely used as a plastic substrate because it is a material that can be coated.

A buffer layer 102 may be disposed on the substrate 101. The buffer layer 102 is a layer for protecting various electrodes and lines from impurities such as alkali ions flowing out from the substrate 101 or lower layers thereof, and may have a multilayer structure formed of a first buffer layer 102*a* and a second buffer layer 102*b*, but the present disclosure is not limited thereto. The buffer layer 102 may be formed of silicon oxide (SiOx) or silicon nitride (SiNx) or multiple layers thereof.

In addition, the buffer layer 102 may delay diffusion of moisture and/or oxygen penetrating into the substrate 101. The buffer layer 102 may include a multi-buffer and/or an active buffer. The active buffer protects an active layer 111 configured as a semiconductor of the driving element 110 and can perform a function of blocking various kinds of impurities introduced from the substrate 101. The active buffer may be formed of amorphous silicon (a-Si) or the like.

The driving element 110 may be formed of the active layer 111, a gate electrode 113, and a source electrode and a drain electrode 112, and may be electrically connected to the organic light emitting element 150 through a connection electrode 114 to transmit a current or signals to the organic light emitting element 150.

The active layer 111 may be disposed on the buffer layer 102. The active layer 111 may be formed of polysilicon (p-Si), and in this case, a selected region thereof may be doped with impurities. In addition, the active layer 111 may be formed of amorphous silicon (a-Si) or may be formed of various organic semiconductor materials such as pentacene and the like. Also, the active layer 111 may be formed of an oxide semiconductor.

A gate insulating layer 103 may be disposed on the active layer 111.

The gate insulating layer 103 may be formed of an insulating inorganic material such as silicon oxide (SiOx) or silicon nitride (SiNx), or may be formed of an insulating organic material or the like.

The gate electrode 113 may be disposed on the gate insulating layer 103.

The gate electrode 113 may be formed of various conductive materials such as nickel (Ni), chromium (Cr), magnesium (Mg), aluminum (Al), molybdenum (Mo), tungsten (W), gold (Au), or alloys of them.

An interlayer insulating layer 104 may be disposed on the gate electrode 113.

The interlayer insulating layer 104 may be formed of an insulating material such as silicon oxide (SiOx) or silicon nitride (SiNx), or may be formed of an insulating organic material or the like.

Contact holes exposing a source region and a drain region of the active layer 111 may be formed by selectively removing the gate insulating layer 103 and the interlayer insulating layer 104. The source electrode and the drain electrode 112 may be formed of an electrode material on the interlayer insulating layer 104, in a single-layer or multi-layer structure.

If necessary, an additional passivation layer formed of an inorganic insulating material may be formed to cover the source electrode and the drain electrode 112.

Meanwhile, in the case of the bottom emission method, a color filter layer CF may be disposed under the organic light emitting element 150, that is, on the interlayer insulating layer 104 in a pixel area. The color filter layer CF may be spaced apart from the driving element 110. The color filter layer CF may include red, green, and blue color filter patterns, and one color filter pattern may correspond to one pixel area.

The planarization layer 105 may be disposed on the driving element 110 and the color filter layer CF.

The planarization layer 105 may have a multilayer structure including at least two layers, and may include, for example, a first planarization layer 105*a* and a second planarization layer 105*b*. The first planarization layer 105*a* may be disposed to cover the driving element 110 and the color filter layer CF, and may be disposed such that portions of the source electrode and the drain electrode 112 of the driving element 110 are exposed.

The planarization layer 105 may extend to the non-active area NA to cover the GIP unit.

The planarization layer 105 may have a thickness of about 2 μm, but is not limited thereto.

The planarization layer 105 may be an overcoat layer, but is not limited thereto.

Meanwhile, the connection electrode 114 for electrically connecting the driving element 110 and the organic light emitting element 150 may be disposed on the first planarization layer 105*a*. In addition, although not shown in FIG. 2, various metal layers serving as lines/electrodes such as data lines or signal lines may be disposed on the first planarization layer 105*a*.

In addition, the second planarization layer 105*b* may be disposed on the first planarization layer 105*a* and the connection electrode 114.

The planarization layer 105 is formed of two layers in the display panel 100 according to the first exemplary embodiment of the present disclosure. It is because various signal lines increase as the display panel 100 has a higher resolution. Since it is difficult to arrange all lines on one layer while securing a minimum distance between the lines, an additional layer is created. Due to the addition of an additional layer, that is, the second planarization layer 105*b*, a margin is created in arrangement of the lines, and arrangement design of lines/electrodes can be facilitated. In addition, when a dielectric material is used as the planarization layer 105 formed of multiple layers, the planarization layer 105 may also be used for forming capacitance between metal layers.

The second planarization layer 105*b* may be formed such that a portion of the connection electrode 114 is exposed, and the drain electrode 112 of the driving element 110 and an anode 151 of the organic light emitting element 150 may be electrically connected by the connection electrode 114.

The organic light emitting element 150 may be configured by sequentially disposing the anode 151, a plurality of organic layers 152, and a cathode 153. That is, the organic light emitting element 150 may include the anode 151 formed on the planarization layer 105, the organic layer 152 formed on the anode 151, and the cathode 153 formed on the organic layer 152.

The electroluminescent display device may be implemented in a top emission method or bottom emission method. In the case of the top emission method, a reflective layer formed of an opaque conductive material with high reflectivity, for example, silver (Ag), aluminum (Al), gold (Au), molybdenum (Mo), tungsten (W), chromium (Cr), or an alloy thereof, may be added under the anode 151 so that light emitted from the organic layer 152 is reflected by the anode 151 and is directed upwardly, that is, in a direction of the cathode 153 disposed thereover. Conversely, in the case of the bottom emission method, the anode 151 may be formed of only a transparent conductive material such as indium tin oxide (ITO), indium zinc oxide (IZO), or indium gallium zinc oxide (IGZO). Hereinafter, it is described assuming that the electroluminescent display device of the present disclosure is in the bottom emission method.

A bank 106 may be formed in an area other than a light emitting area on the planarization layer 105. That is, the bank 106 has a bank hole that exposes the anode 151 corresponding to the light emitting area. The bank 106 may be formed of an inorganic insulating material such as silicon nitride (SiNx) or silicon oxide (SiOx), or an organic insulating material such as BCB, acrylic resin, or imide resin.

The bank 106 may extend to the non-active area NA.

That is, the bank 106 may extend to a portion of the non-active area NA to be spaced apart from an end portion of the substrate 101 by a selected distance.

The bank 106 may have a thickness of about 1 μm, but is not limited thereto.

The bank 106 may cover an upper portion of the GIP unit, but is not limited thereto.

The organic layer 152 may be disposed on the anode 151 that is exposed by the bank 106. The organic layer 152 may include the light emitting layer, an electron injection layer, an electron transport layer, a hole transport layer, a hole injection layer, and the like.

The organic layer 152 may extend to the non-active area NA.

The organic layer 152 may extend to a portion of the non-active area NA to be spaced apart from the end portion of the substrate 101 by a selected distance.

In the non-active area NA, the organic layer 152 may be disposed on the bank 106.

The cathode 153 may be disposed on the organic layer 152.

In the case of the top emission method, the cathode 153 may include a transparent conductive material. For example, the cathode 153 may be formed of indium tin oxide (ITO), indium zinc oxide (IZO), indium gallium zinc oxide (IGZO), or the like. In the case of the bottom emission method, the cathode 153 may include any one of metallic materials such as gold (Au), silver (Ag), aluminum (Al), molybdenum (Mo), magnesium (Mg), palladium (Pd), copper (Cu) or the like, or groups consisting of alloys thereof. Alternatively, the cathode 153 may be configured by stacking a layer formed of a transparent conductive material such as indium tin oxide (ITO), indium zinc oxide (IZO) or indium gallium zinc oxide (IGZO), and a layer formed of a metallic material such as gold (Au), silver (Ag), aluminum (Al), molybdenum (Mo), magnesium (Mg), palladium (Pd), copper (Cu) or the like, or alloys thereof, but is not limited thereto.

The cathode 153 may extend to the non-active area NA.

The cathode 153 may extend to a portion of the non-active area NA to be spaced apart from the end portion of the substrate 101 by a selected distance.

Although not shown, the cathode 153 may be disposed to cover a side surface of the organic layer 152 in the non-active area NA. In this case, the organic layer 152 may be spaced apart from an end portion of the cathode 153 by a selected distance, but is not limited thereto.

In addition, a capping layer formed of a material having a high refractive index and high light absorption may be disposed on the organic light emitting element 150 to reduce diffused reflection of external light.

The capping layer may be an organic material layer formed of an organic material.

The capping layer may extend to the non-active area NA.

Meanwhile, the encapsulation layer 120 formed of multiple layers may be disposed on the organic light emitting element 150.

For reference, elements using organic materials, including light emitting elements, are vulnerable to gases in the air, particularly moisture or oxygen, and have low durability against heat, so a thorough encapsulation process is required therefor.

If an appropriate encapsulation process is not accompanied, a lifetime of the element is rapidly reduced, and a dark spot is formed in the element, which may lead to product defects. Conversely, when an appropriate encapsulation process is applied in an element manufacturing process, reliability of the element can be secured and high-quality elements can be produced.

Conventionally, this encapsulation process is largely divided into two methods.

One method is a cover method in which getters are attached into a cover of glass or metal and then, the cover of glass or metal is attached to an element using an adhesive having low water permeability. The other method is a thin film method in which several types of films are laminated and attached to a light emitting element, or a film is directly deposited on the light emitting element.

Among these methods, materials having excellent oxygen barrier and water vapor barrier properties may be mainly used for the film used in the thin film method.

Specifically describing the encapsulation layer 120, for example, a capping layer is formed on an upper surface of the substrate 101 on which the light emitting element 150 is formed, and a primary passivation layer 120*a*, an organic layer 120*b*, and a secondary passivation layer 120*c* may be sequentially formed on the capping layer to constitute the encapsulation layer 120 as an encapsulation unit. However, the number of inorganic layers and organic layers constituting the encapsulation layer 120 is not limited thereto.

The encapsulation substrate 140 may be disposed on an entire surface of the substrate 101 including the secondary passivation layer 120*c* with the adhesive layer 130 interposed therebetween.

The encapsulation substrate 140 may be formed of a thin metal layer of aluminum foil (Al foil), but is not limited thereto. When the encapsulation substrate 140 is formed of a thin metal layer, reliability of the electroluminescent display device can be improved by connecting the encapsulation substrate 140 to, for example, a low potential voltage supply terminal to shield electromagnetic interference.

The adhesive layer 130 may be formed of an optically transparent adhesive film (OCA) or a pressure sensitive adhesive (PSA).

Meanwhile, as described above, the foreign material FM may be generated during the manufacturing process of the electroluminescent display device. In particular, in the case of the foreign material FM having a large size, the encapsulation layer 120 may not completely cover the foreign material FM.

That is, referring to FIG. 3, although there is a variation depending on a total thickness of the layers stacked on the anode 151, when a width W1 of the foreign material FM exceeds about 2.6 μm, a void is formed in the organic layer 120*b* and a seam is generated in the secondary passivation layer 120*c*. In this case, external moisture and oxygen permeate through the seam in the secondary passivation layer 120*c*, thereby causing oxidation of the cathode 153, so that a size of the generated dark spot increases and consequently, the pixel changes into a dead pixel that is unable to be driven. The pixel that has been normalized through aging also changes into a dark spot and becomes a dead pixel over time.

Accordingly, the first exemplary embodiment of the present disclosure is characterized in that the plurality of barrier layers 180 and 185 are applied to a point where the large foreign material FM is generated to cover the foreign material FM and block oxygen and moisture, thereby allowing for repair of dark spot defects and pixels defects caused by the foreign material FM.

That is, for example, to fill the void in the organic layer 120*b* using an inkjet or dispensing process after measuring a position of the void in the organic layer 120*b* using an auto-optical inspection (AOI), a primary barrier layer 180 may be formed on the foreign material FM.

The primary barrier layer 180 may be formed of a UV curable resin, but is not limited thereto.

The primary barrier layer 180 may serve to prevent damage to the organic layer 152 exposed by the void in the organic layer 120*b* caused by a solvent leaking from a secondary barrier layer 185 to be formed later. That is, the primary barrier layer 180 may be a functional layer that blocks penetration of solvent.

To this end, for example, the primary barrier layer 180 may be formed of acryl, epoxy, acrylated epoxy, acrylated polymer, acrylated urethane or acrylated silicone.

In addition, for example, the primary barrier layer 180 is formed of a material having a viscosity of 15 to 50 cps, a refractive index of 1.5 to 2.0, and a water contact characteristic of 10 ppm or less, and can be cured by UV light of 395 nm.

Thereafter, for example, after curing the primary barrier layer 180 with UV light, the secondary barrier layer 185 may be formed at the same location to cover the primary barrier layer 180.

The secondary barrier layer 185 may be a functional layer that blocks external oxygen.

For example, the secondary barrier layer 185 may be formed of a polyvinyl alcohol (PVA)-based copolymer, and may have a semi-crystalline structure when cured, resulting in excellent gas barrier properties.

For example, the secondary barrier layer 185 may be formed of an epoxy or PVA resin and a filler, and the filler may include talc. Talc can prevent penetration of moisture.

Also, for example, the secondary barrier layer 185 may have an oxygen transmission rate (OTR) of 0.2 cc/$m^2$ at a thickness of 1 to 1.5 μm and a saponification degree of 98 mol %.

For reference, PVA can be obtained by polymerizing polyvinyl acetate and then substituting hydrophobic $CH_3COO$— with hydrophilic —OH through a hydrolysis reaction. At this time, a degree of substitution with —OH relative to the total, that is, a ratio of $CH_3COO$— and —OH is called a saponification degree or a hydration degree. The degree of saponification may vary depending on a molecular weight of PVA or its distribution characteristics during the —OH substitution reaction, and affects final resin properties.

Accordingly, the first exemplary embodiment of the present disclosure can allow for repair of dark spot defects and pixel defects caused by the foreign material FM by preventing penetration of moisture and oxygen.

Meanwhile, in the case of the encapsulation substrate 140, moisture and oxygen may permeate from the outside through a pin-hole. Accordingly, in the present disclosure, penetration of moisture and oxygen can be effectively prevented by applying an additional encapsulation substrate to an upper portion of the plurality of barrier layers 180 and 185. This will be described in detail through a second exemplary embodiment of the present disclosure.

Referring to FIG. 3, as shown, the foreign material FM has a first dimension (e.g., distance, length, width, thickness, radius, diameter, size, or the like) in a first direction. The first direction, for example, can be the X-axis direction. That is, the foreign material FM has a width W1 (or a diameter W1) in the X-axis direction. The primary barrier layer 180 has a second dimension in the first direction. The primary barrier layer 180 is disposed over the foreign material FM such that it fully covers the foreign material FM. The distance between the furthest point that the primary barrier layer 180 extends in a −X direction and the furthest point that the primary barrier layer 180 extends in a +X direction can be defined as the second dimension of the primary barrier layer 180. In the drawings, the second dimension refers to the width W2. In one embodiment, the width W2 of the primary barrier layer 180 is greater than the width W1 of the foreign material FM.

Similarly, the secondary barrier layer 185 has a third dimension in the first direction. The secondary barrier layer 185 is disposed over the primary barrier layer 180 so as to fully cover the primary barrier layer 180. The distance between the furthest point that secondary barrier layer 185 extends in a −X direction and the furthest point that the secondary barrier layer 185 extends in a +X direction can be defined as the third dimension of the secondary barrier layer 185. In the drawings, the third dimension refers to the width W3. In one embodiment, the width W3 of the secondary barrier layer 185 is greater than the width W2 of the primary barrier layer 180.

Figure 4:
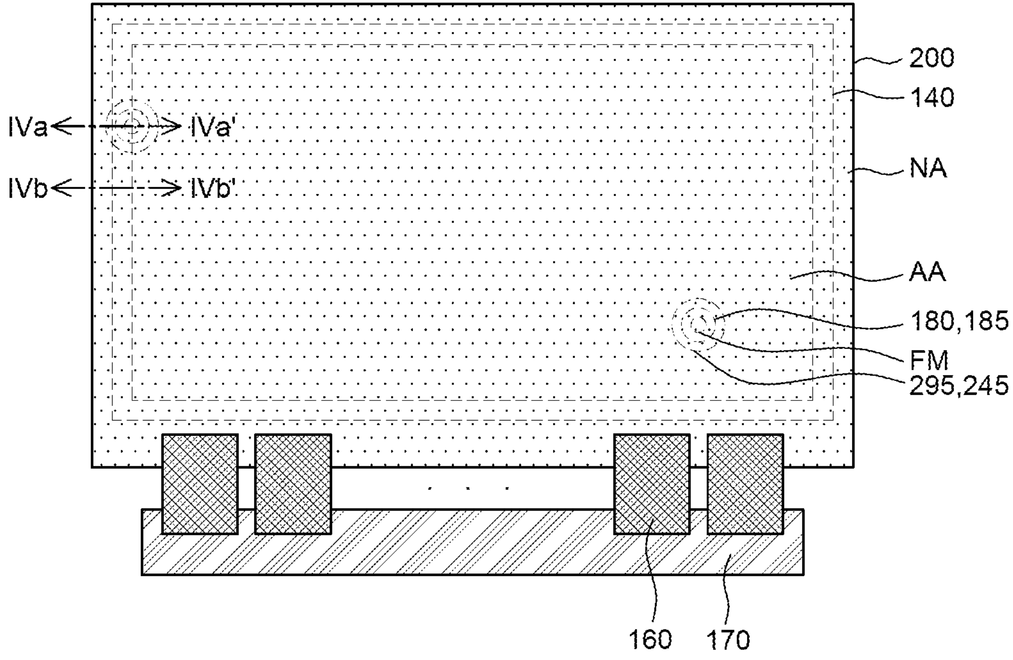
FIG. 4 is a plan view schematically illustrating an electroluminescent display device according to a second exemplary embodiment of the present disclosure.

FIG. 4 is a plan view schematically illustrating an electroluminescent display device according to a second exemplary embodiment of the present disclosure.

Figure 5:
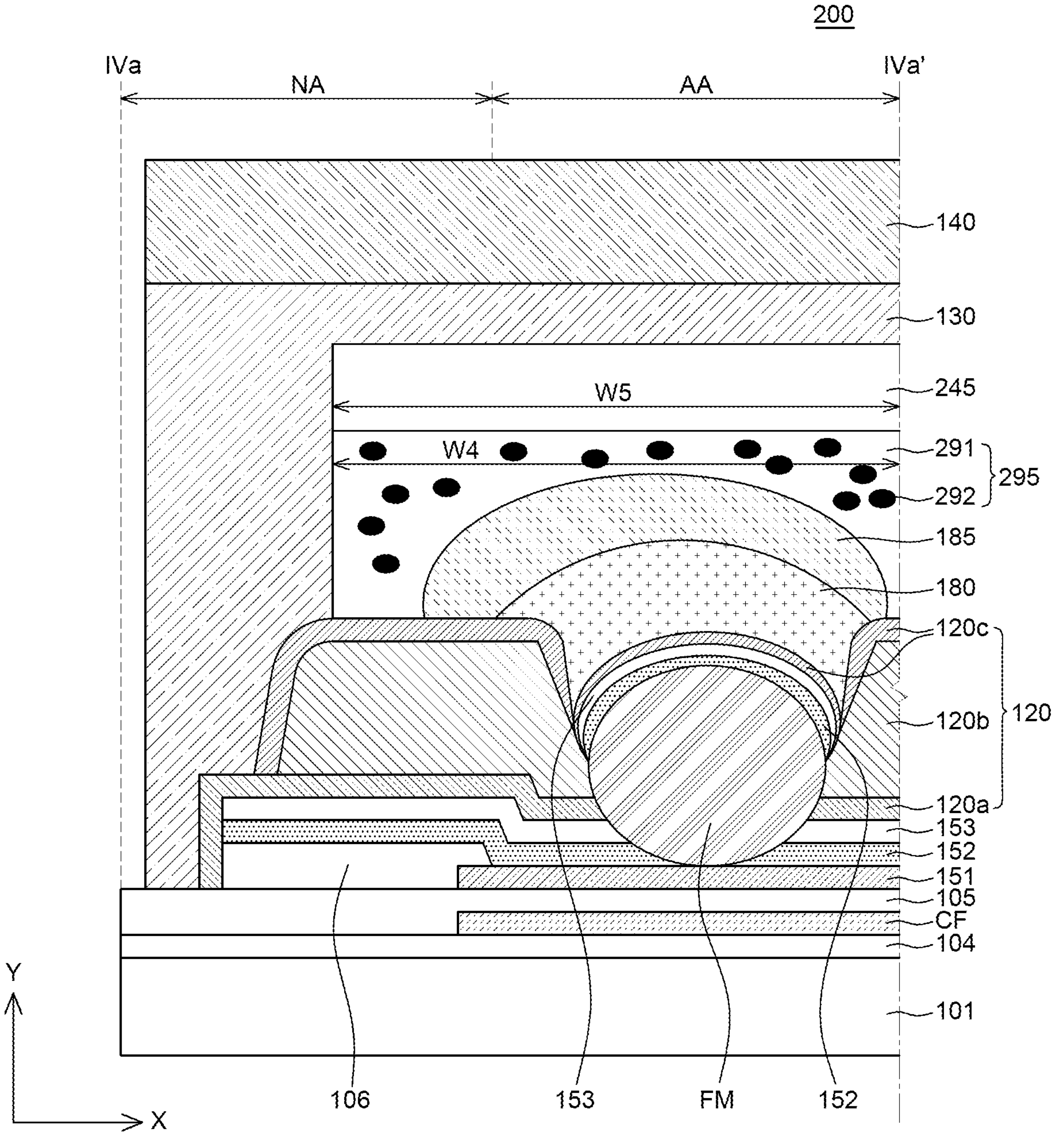
FIG. 5 is a cross-sectional view taken along IVa-IVa' in FIG. 4.

FIG. 5 is a cross-sectional view taken along IVa-IVa' in FIG. 4.

Figure 6:
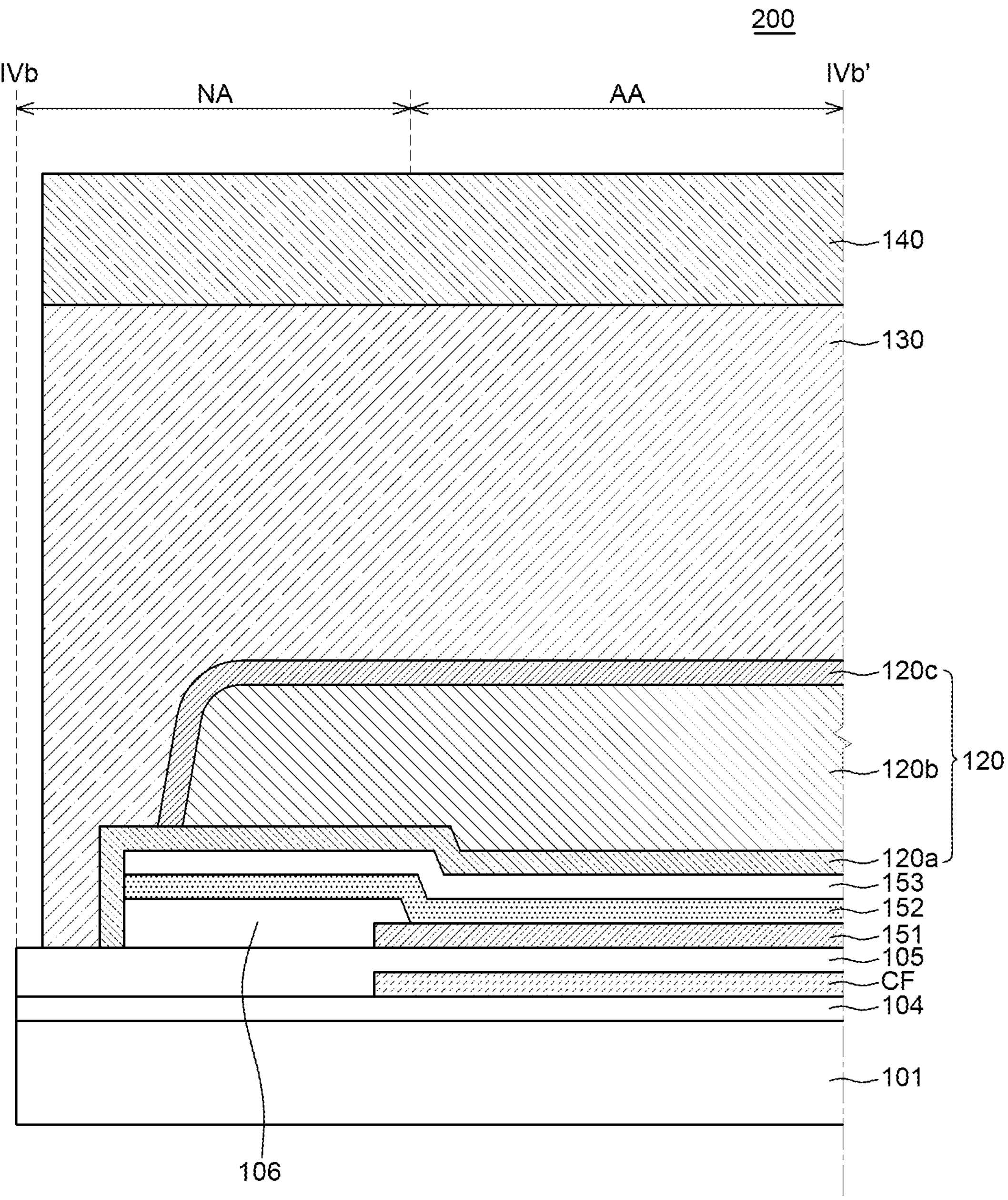
FIG. 6 is a cross-sectional view taken along IVb-IVb' of FIG. 4.

FIG. 6 is a cross-sectional view taken along IVb-IVb' of FIG. 4.

FIGS. 7A to 7D are rear views illustrating a repair process of a display panel shown in FIG. 4 as an example.

In FIG. 4, a case where a foreign material FM is generated at an arbitrary point of a display panel 200 is illustrated as an example. However, the present disclosure is not limited to presence or absence of a foreign material FM and the number and occurrence points of foreign materials FM.

Since other configurations of the display panel 200 according to the second exemplary embodiment of FIGS. 4 to 6 are substantially identical to those of the display panel 100 according to the first exemplary embodiment of FIGS. 2 and 3 with only differences in an additional encapsulation substrate 245 and a tertiary barrier layer 295, redundant descriptions thereof will be omitted. Here, the additional encapsulation substrate 245 may be called a mini-encapsulation substrate or another encapsulation substrate for the encapsulation substrate 140.

FIGS. 5 and 6 show cross-sections of a left side of the display panel 200. In particular, FIG. 5 shows a cross-section of the display panel 100 where the foreign material FM is generated, and FIG. 6 shows a cross-section of the display panel 100 where the foreign material FM does not occur. In FIGS. 5 and 6, detailed illustrations of the pixel unit of the active area AA and the GIP unit of the non-active area NA are omitted for convenience of description.

FIG. 4 is a plan view viewed from a side of the substrate 101 on which an image is displayed, while FIGS. 7A to 7D are rear views viewed from a side of the encapsulation substrate 140, which is opposite to the substrate 101.

Referring to FIGS. 4 to 6, the electroluminescent display device according to the second exemplary embodiment of the present disclosure may be configured to include the display panel 200, the flexible films 160, the printed circuit board 170, and the encapsulation board 140.

Although not shown, a driving element may be disposed on the substrate 101.

In addition, the planarization layer 105 may be disposed on the driving element.

The planarization layer 105 may extend to the non-active area NA to cover the GIP unit.

The planarization layer 105 may be an overcoat layer, but is not limited thereto.

In addition, an organic light emitting element that is electrically connected to the driving element is disposed on the planarization layer 105, and the encapsulation layer 120 formed of multiple layers is disposed on the organic light emitting element so that penetration of oxygen and moisture into the organic light emitting element can be reduced or minimized.

The organic light emitting element may include the anode 151 formed on the planarization layer 105, the organic layer 152 formed on the anode 151, and the cathode 153 formed on the organic layer 152.

The bank 106 may be disposed on the planarization layer 105 in an area other than a light emitting area.

The bank 106 may extend to the non-active area NA.

That is, the bank 106 may extend to a portion of the non-active area NA to be spaced apart from an end portion of the substrate 101 by a selected distance.

The bank 106 may cover an upper portion of the GIP unit, but is not limited thereto.

The organic layer 152 may be disposed on the anode 151 exposed by the bank 106. The organic layer 152 may include a light emitting layer, an electron injection layer, an electron transport layer, a hole transport layer, a hole injection layer, and the like.

The organic layer 152 may extend to the non-active area NA.

The organic layer 152 may extend to a portion of the non-active area NA to be spaced apart from the end portion of the substrate 101 by a selected distance.

In the non-active area NA, the organic layer 152 may be disposed on the bank 106.

The cathode 153 may be disposed on the organic layer 152.

The cathode 153 may extend to the non-active area NA.

The cathode 153 may extend to a portion of the non-active area NA to be spaced apart from the end portion of the substrate 101 by a selected distance.

Although not shown, the cathode 153 may be disposed to cover the side surface of the organic layer 152 in the non-active area NA. In this case, the organic layer 152 may be spaced apart from an end portion of the cathode 153 by a selected distance, but is not limited thereto.

In addition, a capping layer formed of a material having a high refractive index and high light absorption may be disposed on the organic light emitting element 150 to reduce diffused reflection of external light.

Meanwhile, specifically describing the encapsulation layer 120, for example, a capping layer is formed on the upper surface of the substrate 101 on which the light emitting element 150 is formed, and the primary passivation layer 120*a*, the organic layer 120*b*, and the secondary passivation layer 120*c* may be sequentially formed on the capping layer to constitute the encapsulation layer 120 as an encapsulation unit. However, the number of inorganic layers and organic layers constituting the encapsulation layer 120 is not limited thereto.

The encapsulation substrate 140 may be disposed on an entire surface of the substrate 101 including the secondary passivation layer 120*c* with the adhesive layer 130 interposed therebetween, but the present disclosure is not limited thereto. In addition, a sealing member and a reinforcing substrate may be sequentially disposed on the encapsulation layer 120.

Meanwhile, as described above, a foreign material FM may be generated during a manufacturing process of the electroluminescent display device.

Figure 7A:
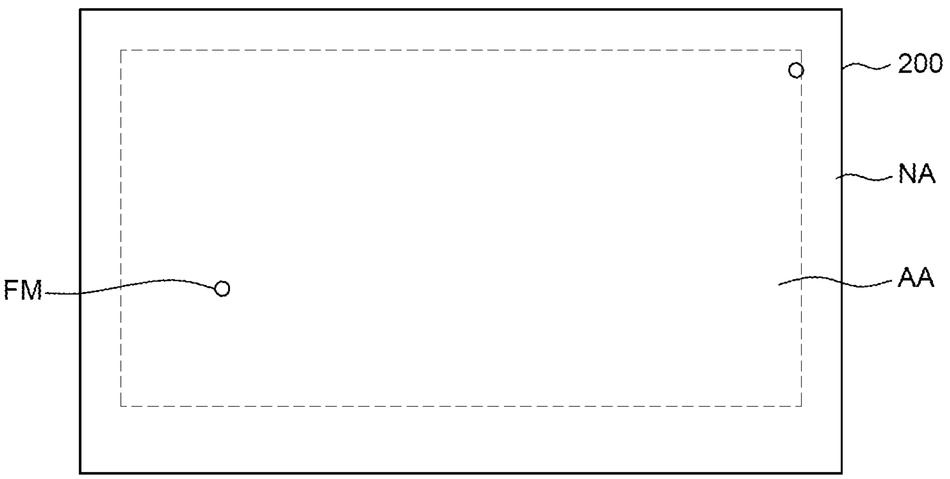
FIGS. 7A to 7D are rear views illustrating a repair process of a display panel shown in FIG. 4 as an example.

That is, referring to FIG. 7A together, a foreign material FM may occur at an arbitrary point of the display panel 200. The foreign material FM may be present on an upper portion of the bank 106 in the non-active area NA, on an upper portion of the anode 151 or the planarization layer 105 in the active area AA.

When an organic material of the organic layer 152 is deposited on the foreign material FM, a void may occur in the organic layer 152 around the foreign material FM.

When the cathode 153 is deposited on the foreign material FM, the cathode 153 does not sufficiently cover the organic layer 152, and a short circuit may occur between the cathode 153 and the anode 151 due to the foreign material FM. In this case, insulation may be achieved through aging, but the first passivation layer 120*a*, the organic layer 120*b*, and the second passivation layer 120*c* that are deposited later do not sufficiently cover lower layers thereof. In particular, when the size of the foreign material FM exceeds about 2.6 μm, a void is generated in the organic layer 120*b* and a seam is generated in the secondary passivation layer 120*c*. In this case, external moisture and oxygen penetrate through the seam in the secondary passivation layer 120*c*, thereby causing oxidation of the cathode 153, so that a size of the generated dark spot increases and consequently, the pixel changes into a dead pixel that is unable to be driven.

Accordingly, the second exemplary embodiment of the present disclosure is characterized in that the plurality of barrier layers 180 and 185 are applied to a point where the foreign material FM is generated to cover the foreign material FM and block oxygen and moisture, thereby allowing for repair of dark spot defects and pixels defects caused by the foreign material FM, in the same manner as the first exemplary embodiment of the present disclosure described above.

Figure 7B:
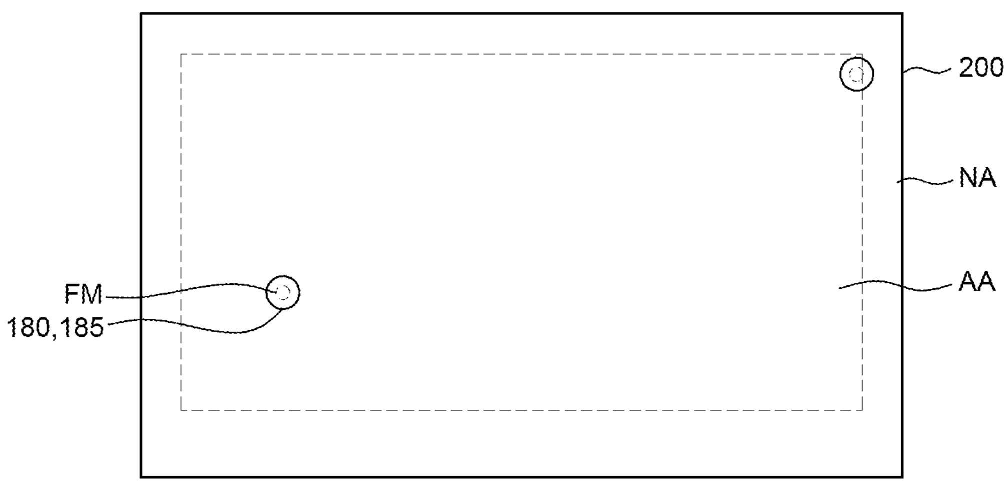

That is, referring to FIG. 7B together, for example, to fill the void in the organic layer 120*b* using an inkjet or dispensing process after measuring a position of the void in the organic layer 120*b* using an auto-optical inspection (AOI), the primary barrier layer 180 may be formed on the foreign material FM.

The primary barrier layer 180 may be formed of a UV curable resin, but is not limited thereto.

The primary barrier layer 180 may serve to prevent damage to the organic layer 152 exposed by the void in the organic layer 120*b* caused by a solvent leaking from the secondary barrier layer 185 to be formed later. That is, the primary barrier layer 180 may be a functional layer that blocks penetration of solvent.

To this end, for example, the primary barrier layer 180 may be formed of acryl, epoxy, acrylated epoxy, acrylated polymer, acrylated urethane or acrylated silicone.

In addition, for example, the primary barrier layer 180 is formed of a material having a viscosity of 15 to 50 cps, a refractive index of 1.5 to 2.0, and a water contact characteristic of 10 ppm or less, and can be cured by UV light of 395 nm.

Thereafter, for example, after curing the primary barrier layer 180 with UV light, the secondary barrier layer 185 may be formed at the same location to cover the primary barrier layer 180.

The secondary barrier layer 185 may have a larger area than the primary barrier layer 180, and thus may sufficiently cover the primary barrier layer 180.

The secondary barrier layer 185 may be a functional layer that blocks external oxygen. That is, the secondary barrier layer 185 may be any suitable layer that is configured to blocks external oxygen.

For example, the secondary barrier layer 185 may be formed of a polyvinyl alcohol (PVA)-based copolymer, and may have a semi-crystalline structure when cured, resulting in excellent gas barrier properties.

For example, the secondary barrier layer 185 may be formed of an epoxy or PVA resin and a filler, and the filler may include talc. Talc can prevent penetration of moisture.

Also, for example, the secondary barrier layer 185 may have an oxygen transmission rate (OTR) of 0.2 cc/$m^2$ at a thickness of 1 to 1.5 μm and a saponification degree of 98 mol %.

Accordingly, the second exemplary embodiment of the present disclosure can allow for repair of dark spot defects and pixel defects caused by the foreign material FM by preventing penetration of moisture and oxygen.

Figure 7C:
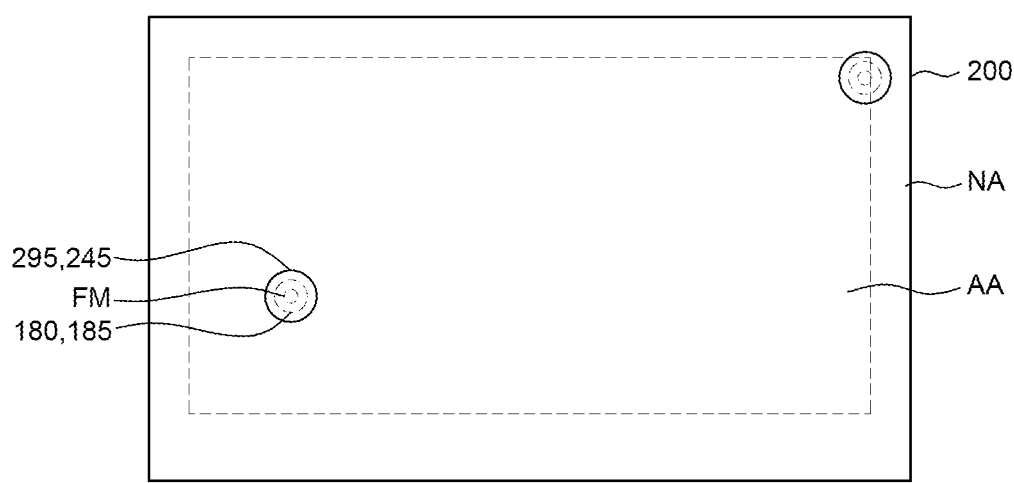

Meanwhile, referring to FIG. 7C together, the second exemplary embodiment of the present disclosure is characterized in that the additional encapsulation substrate 245 is attached to cover the secondary barrier layer 185 on an upper portion of the foreign material FM, using a stamp process.

At this time, the secondary barrier layer 185 may be dried by applying a certain temperature or heat before the stamping process.

The additional encapsulation substrate 245 may be formed with a larger area than the secondary barrier layer 185, and thus may sufficiently cover the secondary barrier layer 185.

The additional encapsulation substrate 245 may be attached to the substrate 101 via the tertiary barrier layer 295. The tertiary barrier layer 295 may be a functional layer for attaching the additional encapsulation substrate 245 to an upper portion of the substrate 101.

The additional encapsulation substrate 245 may be formed of a thin metal layer of aluminum foil (Al foil) having a thickness of 12 μm or less, but is not limited thereto.

The tertiary barrier layer 295 may include a resin 291 having adhesive properties and getters 292 dispersed in the resin 291.

The tertiary barrier layer 295 may have a thickness of 50 μm or less, but is not limited thereto.

The resin 291 may be formed of any one of olefin-based and epoxy-based polymer materials.

The getters 292 may include at least one of barium oxide (BaO), calcium oxide (CaO), magnesium oxide (MgO), magnesium sulfate ($MgSO_4$), sodium oxide ($Na_2O$), sodium sulfate ($Na_2SO_4$), lithium sulfate (LiSO), calcium sulfate ($CaSO_4$), potassium oxide ($K_2O$), lithium oxide ($Li_2O$), gallium sulfate (GaS), calcium chloride ($CaCl_2$), magnesium chloride ($MgCl_2$), calcium bromide ($CaBr_2$), cerium bromide (CsBr), vanadium bromide ($VBr_5$) and calcium nitrate ($Ca(No_3)_2$).

The getters 292 may be formed of particles having a size of about 50 to 100 nm. The getters 292 may be formed of a transparent material, but is not limited thereto.

At this time, the secondary passivation layer 120*c* is formed of a thin film of about 0.5-2 μm, which is vulnerable to scratches by foreign material FM, so the additional encapsulation substrate 245 and the tertiary barrier layer 295 as passivation layers can serve as buffers for the secondary passivation layer 120*c*.

Figure 7D:
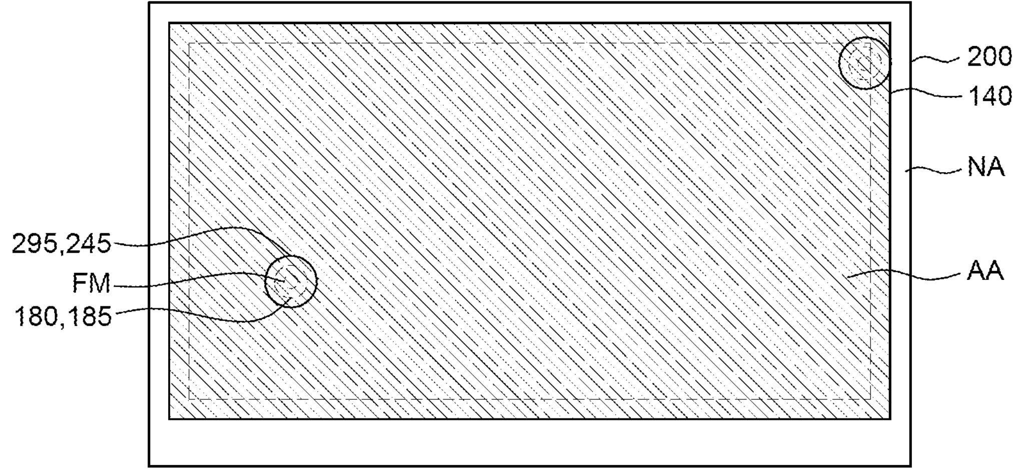

Meanwhile, referring to FIG. 7D together, the encapsulation substrate 140 may be disposed on the entire surface of the substrate 101 to which the additional encapsulation substrate 245 is attached, with the adhesive layer 130 interposed therebetween.

The encapsulation substrate 140 may be formed of a thin metal layer of aluminum foil (Al foil), but is not limited thereto. When the encapsulation substrate 140 is formed of a thin metal layer, reliability of the electroluminescent display device can be improved by connecting the encapsulation substrate 140 to, for example, a low potential voltage supply terminal to shield electromagnetic interference.

The adhesive layer 130 may be formed of an optically transparent adhesive film (OCA) or a pressure sensitive adhesive (PSA).

Meanwhile, in the case of the encapsulation substrate 140, moisture and oxygen may be permeated from the outside through a pin-hole. In the second exemplary embodiment of the present disclosure, by applying the additional encapsulation substrate 245 to the upper portion of the plurality of barrier layers 180 and 185 to form a double layer together with the encapsulation substrate 140, it is possible to effectively prevent penetration of moisture and oxygen by the pin-hole. That is, when the encapsulation substrate 140 is attached to the entire surface of the substrate 101 with the adhesive layer 130 interposed therebetween after the additional encapsulation substrate 245 is attached, even if a pin-hole is generated in the encapsulation substrate 140, the additional encapsulation substrate 245 may cover the pin-hole. That is, as the pin-hole of the encapsulation substrate 140 and the pin-hole of the additional encapsulation substrate 245 are randomly formed, the additional encapsulation substrate 245 and the encapsulation substrate 140 constituting a double layer can effectively delay the permeation of external moisture and oxygen through the pin-holes.

Referring to FIG. 5, as shown, the tertiary barrier layer 295 has a fourth dimension in a first direction. The first direction, for example, can be the X-axis direction. That is, the tertiary barrier layer 295 has a width W4 in the X-axis direction. The secondary barrier layer 185 has a third dimension in the first direction. The tertiary barrier layer 295 is disposed over the secondary barrier layer 185 such that it fully covers the secondary barrier layer 185. The distance between the furthest point that the tertiary barrier layer 295 extends in a −X direction and the furthest point that the tertiary barrier layer 295 extends in a +X direction can be defined as the fourth dimension of the tertiary barrier layer 295. In the drawings, the fourth dimension refers to the width W4. In one embodiment, the width W4 of the tertiary barrier layer 295 is greater than the width W3 of the secondary barrier layer 185.

Similarly, the additional encapsulation substrate 245 (also referred to as a first encapsulation substrate in some embodiments) has a fifth dimension in the first direction. The additional encapsulation substrate 245 is disposed over the tertiary barrier layer 295 so as to fully cover the tertiary barrier layer 295. The distance between the furthest point that the additional encapsulation substrate 245 extends in a −X direction and the furthest point that additional encapsulation substrate 245 extends in a +X direction can be defined as the fifth dimension of the additional encapsulation substrate 245. In the drawings, the fifth dimension refers to the width W5. In one embodiment, the width W5 of the additional encapsulation substrate 245 is equal to or greater than the width W4 of the tertiary barrier layer 295.

Accordingly, in the second exemplary embodiment of the present disclosure, it is possible to improve reliability of moisture permeation prevention performance.

Meanwhile, an adhesive layer may be additionally provided under the tertiary barrier layer 295, which will be described in detail with reference to FIG. 8 below.

Figure 8:
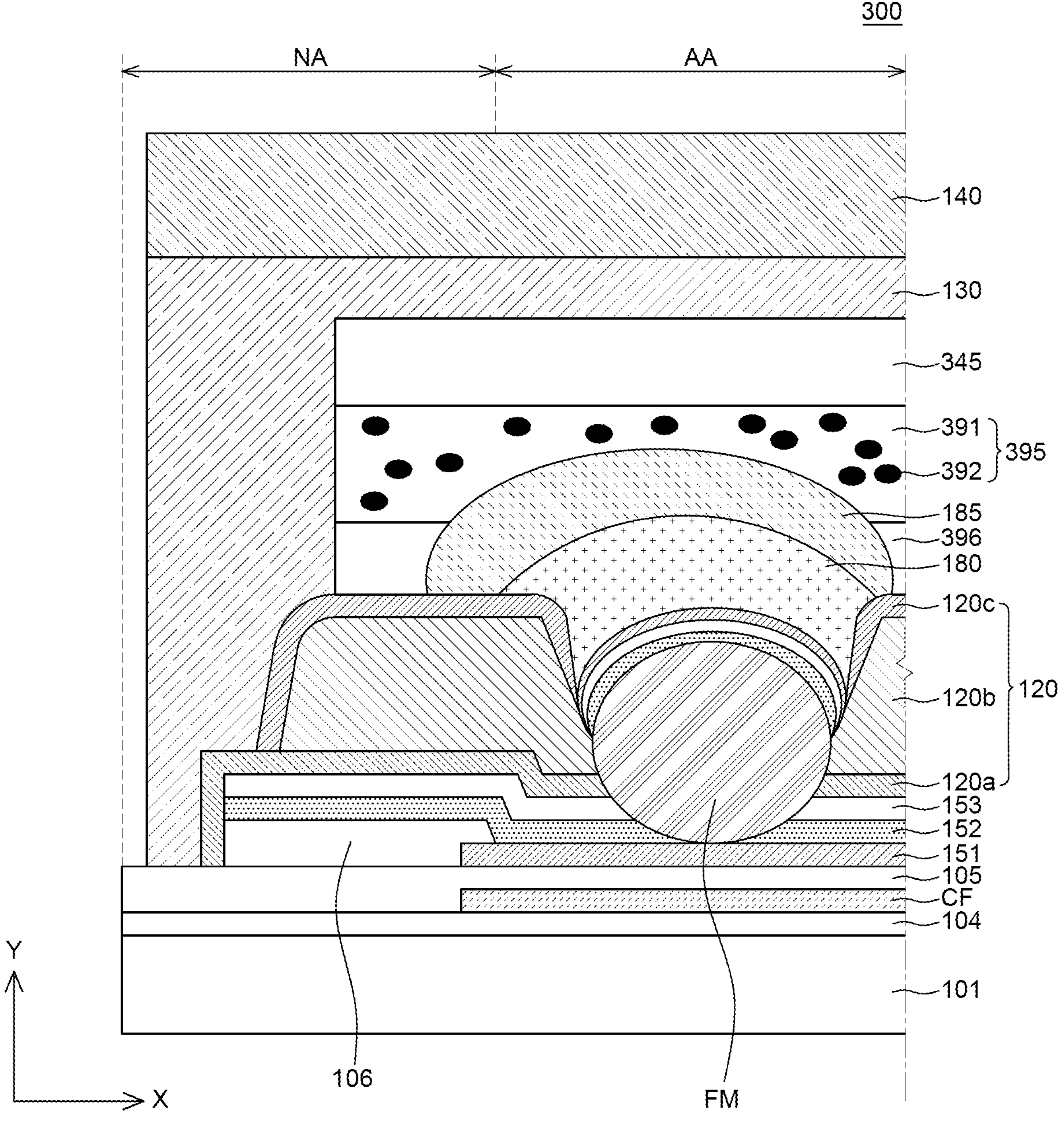
FIG. 8 is a cross-sectional view illustrating a display panel according to a third exemplary embodiment of the present disclosure.

FIG. 8 is a cross-sectional view illustrating a display panel according to a third exemplary embodiment of the present disclosure.

Since other configurations of a display panel 300 of the third exemplary embodiment of the present disclosure shown in FIG. 8 are substantially identical to those of the display panel 200 of the second exemplary embodiment shown in FIGS. 5 and 6 with only a difference in that an additional adhesive layer 396 is provided, redundant descriptions thereof will be omitted.

FIG. 8 illustrates a cross-section of the display panel 300 where a foreign material FM is generated as an example. In addition, in FIG. 8, detailed illustrations of the pixel unit of the active area AA and the GIP unit of the non-active area NA are omitted for convenience of description.

Referring to FIG. 8, in the electroluminescent display device according to the third exemplary embodiment of the present disclosure, a driving element may be disposed on the substrate 101.

In addition, the planarization layer 105 may be disposed on the driving element.

In addition, an organic light emitting element that is electrically connected to the driving element may be disposed on the planarization layer 105, and the encapsulation layer 120 having multiple layers may be disposed on the organic light emitting element.

The bank 106 may be disposed on the planarization layer 105 in an area other than a light emitting area.

The organic layer 152 may be disposed on the anode 151 exposed by the bank 106.

In the non-active area NA, the organic layer 152 may be disposed on the bank 106.

The cathode 153 may be disposed on the organic layer 152.

Meanwhile, specifically describing the encapsulation layer 120, for example, a capping layer is formed on an upper surface of the substrate 101 on which the light emitting element 150 is formed, and the primary passivation layer 120*a*, the organic layer 120*b*, and the secondary passivation layer 120*c* may be sequentially formed on the capping layer to constitute the encapsulation layer 120 as an encapsulation unit.

The encapsulation substrate 140 may be disposed on the entire surface of the substrate 101 including the secondary passivation layer 120*c* with the adhesive layer 130 interposed therebetween, but the present disclosure is not limited thereto. In addition, a sealing member and a reinforcing substrate may be sequentially disposed on the encapsulation layer 120.

Meanwhile, as described above, a foreign material FM may be generated during a manufacturing process of the electroluminescent display device.

Accordingly, the third exemplary embodiment of the present disclosure is characterized by applying multilayered barrier layers 180 and 185 to a point where the foreign material FM is generated in the same manner as the first and second exemplary embodiments of the present disclosure described above.

That is, the primary barrier layer 180 may be formed on the foreign material FM.

In addition, the secondary barrier layer 185 may be formed to cover the primary barrier layer 180.

Accordingly, the third exemplary embodiment of the present disclosure can allow for repair of dark spot defects and pixel defects caused by the foreign material FM by preventing penetration of moisture and oxygen.

In addition, the third exemplary embodiment of the present disclosure is characterized in that the additional encapsulation substrate 345 is attached to cover the secondary barrier layer 185 on an upper portion of the foreign material FM, using a stamp process, in the same manner as above-described second exemplary embodiment of the present disclosure.

At this time, the secondary barrier layer 185 may be dried by applying a certain temperature or heat before the stamping process.

The additional encapsulation substrate 345 may be formed with a larger area than the secondary barrier layer 185, and thus may sufficiently cover the secondary barrier layer 185.

The additional encapsulation substrate 345 may be attached to the substrate 101 via a tertiary barrier layer 395. The tertiary barrier layer 395 may be a functional layer for attaching the additional encapsulation substrate 345 to an upper portion of the substrate 101.

The additional encapsulation substrate 345 may be formed of a thin metal layer of aluminum foil (Al foil) having a thickness of 12 μm or less, but is not limited thereto.

The tertiary barrier layer 395 may include a resin 391 having adhesive properties and getters 392 dispersed in the resin 391.

The tertiary barrier layer 395 may have a thickness of 30 μm or less, but is not limited thereto.

Meanwhile, the third exemplary embodiment of the present disclosure is characterized in that the additional adhesive layer 396 having a thickness of 20 μm or less is provided under the tertiary barrier layer 395. Here, the additional adhesive layer 396 may be called a mini-adhesive layer or another adhesive layer for the adhesive layer 130.

At this time, the secondary passivation layer 120*c* is formed of a thin film of about 0.5 to 2 μm, which is vulnerable to scratches by the foreign material FM, so the additional encapsulation substrate 345, the tertiary barrier layer 395, and the additional adhesive layer 396 as passivation layers can serve as buffers for the secondary passivation layer 120*c*.

In addition, as described above, the encapsulation substrate 140 may be disposed on the entire surface of the substrate 101 to which the additional encapsulation substrate 345 is attached, with the adhesive layer 130 interposed therebetween.

Meanwhile, an auxiliary substrate may be added on the encapsulation substrate 140 formed of a thin metal layer, and in this case, a portion of the auxiliary substrate may be removed for connection with a low potential voltage supply terminal. It will be described in detail with reference to FIG. 10.

Figure 9:
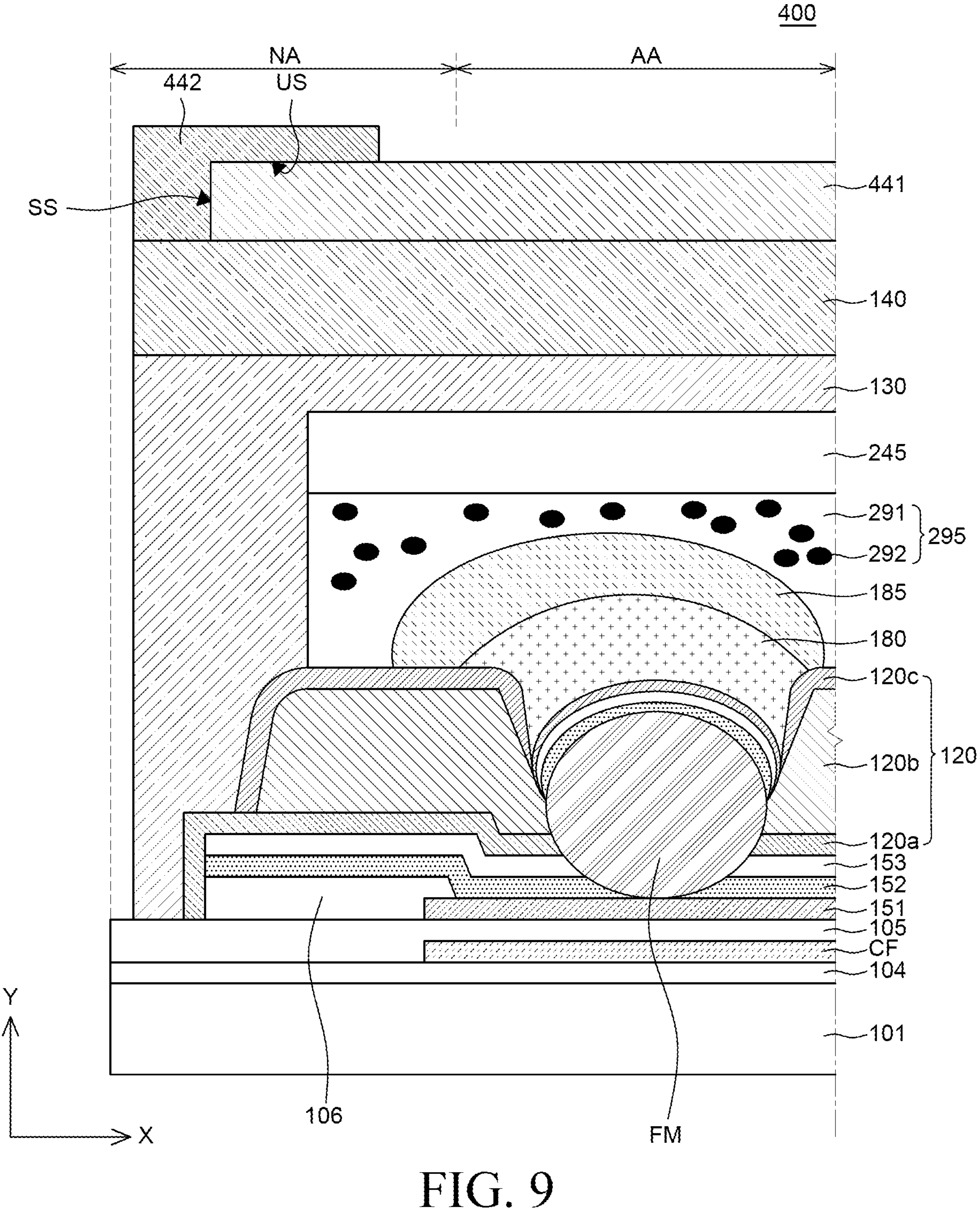
FIG. 9 is a cross-sectional view illustrating a display panel according to a fourth exemplary embodiment of the present disclosure.

FIG. 9 is a cross-sectional view illustrating a display panel according to a fourth exemplary embodiment of the present disclosure.

Figure 10:
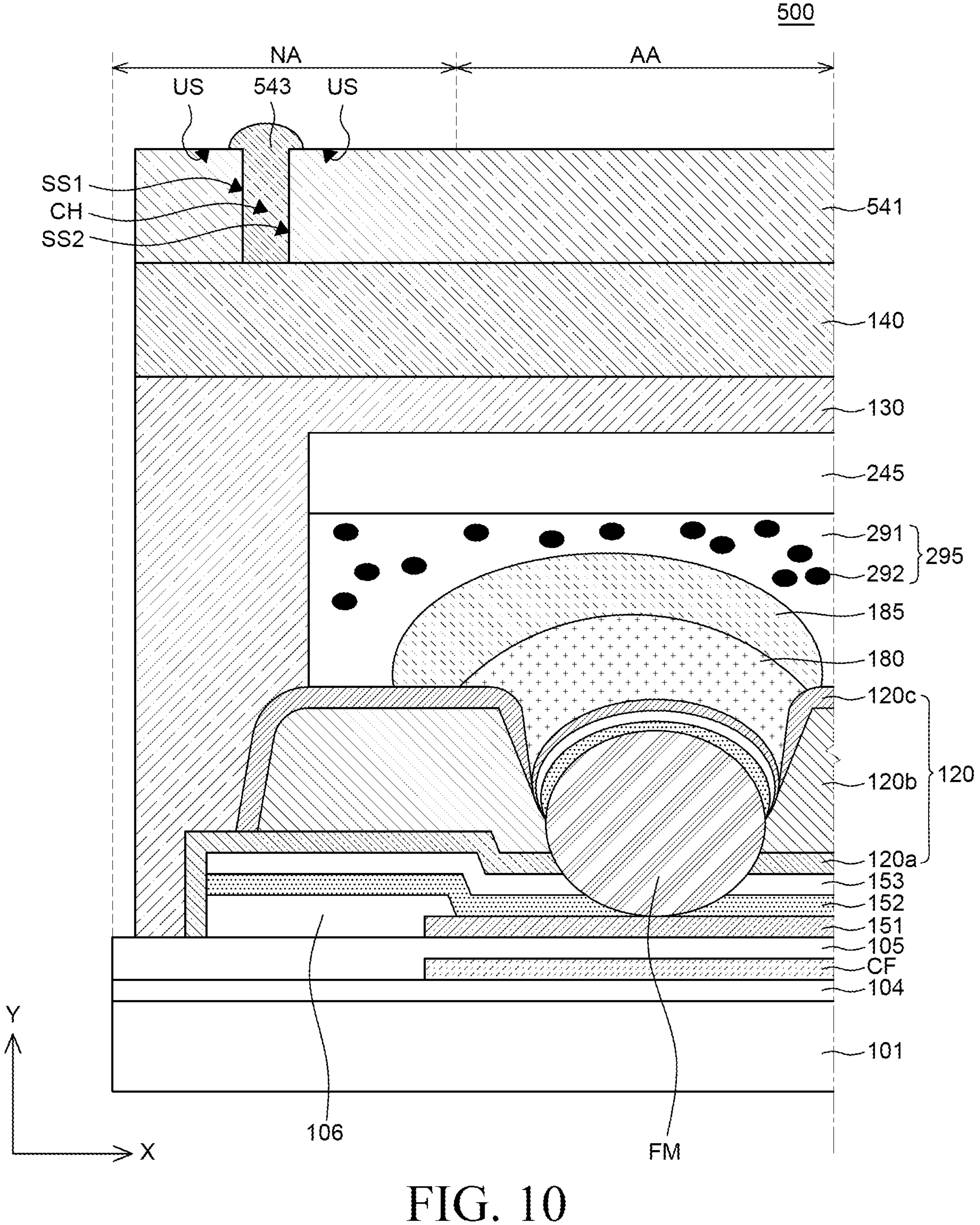
FIG. 10 is a cross-sectional view illustrating a display panel according to a fifth exemplary embodiment of the present disclosure.

FIG. 10 is a cross-sectional view illustrating a display panel according to a fifth exemplary embodiment of the present disclosure.

Since other configurations of display panels 400 and 500 of the fourth and fifth exemplary embodiments of the present disclosure shown in FIGS. 9 and 10 are substantially identical to those of the display panel 200 of the second exemplary embodiment shown in FIGS. 5 and 6 with only differences in that auxiliary substrates 441 and 541 are additionally provided, redundant descriptions thereof will be omitted.

FIGS. 9 and 10 illustrate cross-sections of the display panels 400 and 500 where a foreign material FM is generated as an example. In FIGS. 9 and 10, detailed illustrations of the pixel unit of the active area AA and the GIP unit of the non-active area NA are omitted for convenience of description.

Referring to FIGS. 9 and 10, in the electroluminescent display device according to the fourth and fifth exemplary embodiments of the present disclosure, a driving element may be disposed on the substrate 101.

In addition, the planarization layer 105 may be disposed on the driving element.

In addition, an organic light emitting element electrically connected to the driving element may be disposed on the planarization layer 105, and the encapsulation layer 120 having multiple layers may be disposed on the organic light emitting element.

That is, a capping layer is formed on the upper surface of the substrate 101 on which the light emitting element is formed, and the primary passivation layer 120*a*, the organic layer 120*b*, and the secondary passivation layer 120*c* may be sequentially formed on the capping layer to constitute the encapsulation layer 120 as an encapsulation unit.

The encapsulation substrate 140 may be disposed on the entire surface of the substrate 101 including the secondary passivation layer 120*c* with the adhesive layer 130 interposed therebetween, but the present disclosure is not limited thereto. In addition, a sealing member and a reinforcing substrate may be sequentially disposed on the encapsulation layer 120.

Meanwhile, the fourth and fifth exemplary embodiments of the present disclosure are characterized by applying the multilayered barrier layers 180 and 185 to a point where the foreign material FM is generated in the same manner as the first, second, and the third exemplary embodiments of the present disclosure described above.

That is, the primary barrier layer 180 may be formed on the foreign material FM.

In addition, the secondary barrier layer 185 may be formed to cover the primary barrier layer 180.

In addition, the fourth and fifth exemplary embodiments of the present disclosure are characterized in that the additional encapsulation substrate 245 is attached to cover the secondary barrier layer 185 on an upper portion of the foreign material FM, using a stamp process, in the same manner as the second and third exemplary embodiments of the present disclosure described above.

The additional encapsulation substrate 245 may be attached to the substrate 101 via the tertiary barrier layer 295 interposed therebetween.

In addition, as described above, the encapsulation substrate 140 may be disposed on the entire surface of the substrate 101 to which the additional encapsulation substrate 245 is attached, with the adhesive layer 130 interposed therebetween.

In addition, in the fourth and fifth exemplary embodiments of the present disclosure, the auxiliary substrates 441 and 541 may be additionally disposed on the encapsulation substrate 140, and in this case, partial regions of the auxiliary substrates 441 and 541 are removed for connection with the low potential voltage supply terminal.

Referring to FIG. 9, the auxiliary substrate 441 may extend to a portion of the non-active area NA so as to be spaced apart from an end portion of the encapsulation substrate 140 by a selected distance, so that the end portion of the encapsulation substrate 140 can be partially exposed.

A conductive tape 442 for connection with the low potential voltage supply terminal may be attached to the end portion of the encapsulation substrate 140 exposed in this manner. That is, the conductive tape 442 may be attached on the auxiliary substrate 441 so as to cover parts of a side surface and an upper surface of the auxiliary substrate 441 from the exposed end portion of the encapsulation substrate 140. For reference, the low potential voltage supply terminal provided on a control board may be connected to a low potential voltage through a COF.

The conductive tape 442 may include a conductive material having conductivity.

The auxiliary substrate 441 has an upper surface US and a side surface SS extending from the upper surface US. In one embodiment, the conductive tape 442 at least partially covers the upper surface US of the auxiliary substrate 441 and fully covers the side surface SS of the auxiliary substrate 441.

Referring to FIG. 10, the auxiliary substrate 541 may extend to a portion of the non-active area NA to coincide with the end portion of the encapsulation substrate 140, and instead, a contact hole is formed in a part of the auxiliary substrate 541. Thus, a portion of an upper surface of the encapsulation substrate 140 may be exposed.

A conductive paste 543 may be injected from an upper surface US of the auxiliary substrate 541 into the upper surface US of the encapsulation substrate 140 exposed in this manner through a contact hole CH, and may be connected to the low potential voltage supply terminal. That is, the conductive paste 543 is injected so as to cover a portion of the upper surface US of the auxiliary substrate 441 as well as the contact hole CH, and may come into contact with the portion of the upper surface US of the auxiliary substrate 441, a portion of an inner side surface of the auxiliary substrate 441 where the contact hole CH is formed, and the portion of the upper surface US of the encapsulation substrate 140. In this case, the low potential voltage supply terminal provided on the control board may be connected to the low potential voltage through the COF.

The conductive paste 543 may include a conductive material having conductivity.

Referring to FIG. 10, the auxiliary substrate 541 has an upper surface US and side surfaces SS1, SS2 extending from the upper surface US. In one embodiment, the contact hole CH extends from the upper surface US and extends through the auxiliary substrate 541. The contact hole CH forms two side surfaces SS1, SS2 of the auxiliary substrate 541. The conductive paste 543 is disposed on the auxiliary substrate 541 and the contact hole CH. Here, the conductive paste 543 fills the contact hole CH and also protrudes above the upper surface US of the auxiliary substrate 541.

As such, in the fourth and fifth exemplary embodiments of the present disclosure, reliability of the electroluminescent display device can be improved by connecting the encapsulation substrate 140 to a low potential voltage to shield electromagnetic interference.

Meanwhile, the present disclosure can prevent (insulate) a short-circuit between the cathode 153 and the anode 151 through an aging process, which will be described in detail with reference to FIG. 11.

Figure 11:
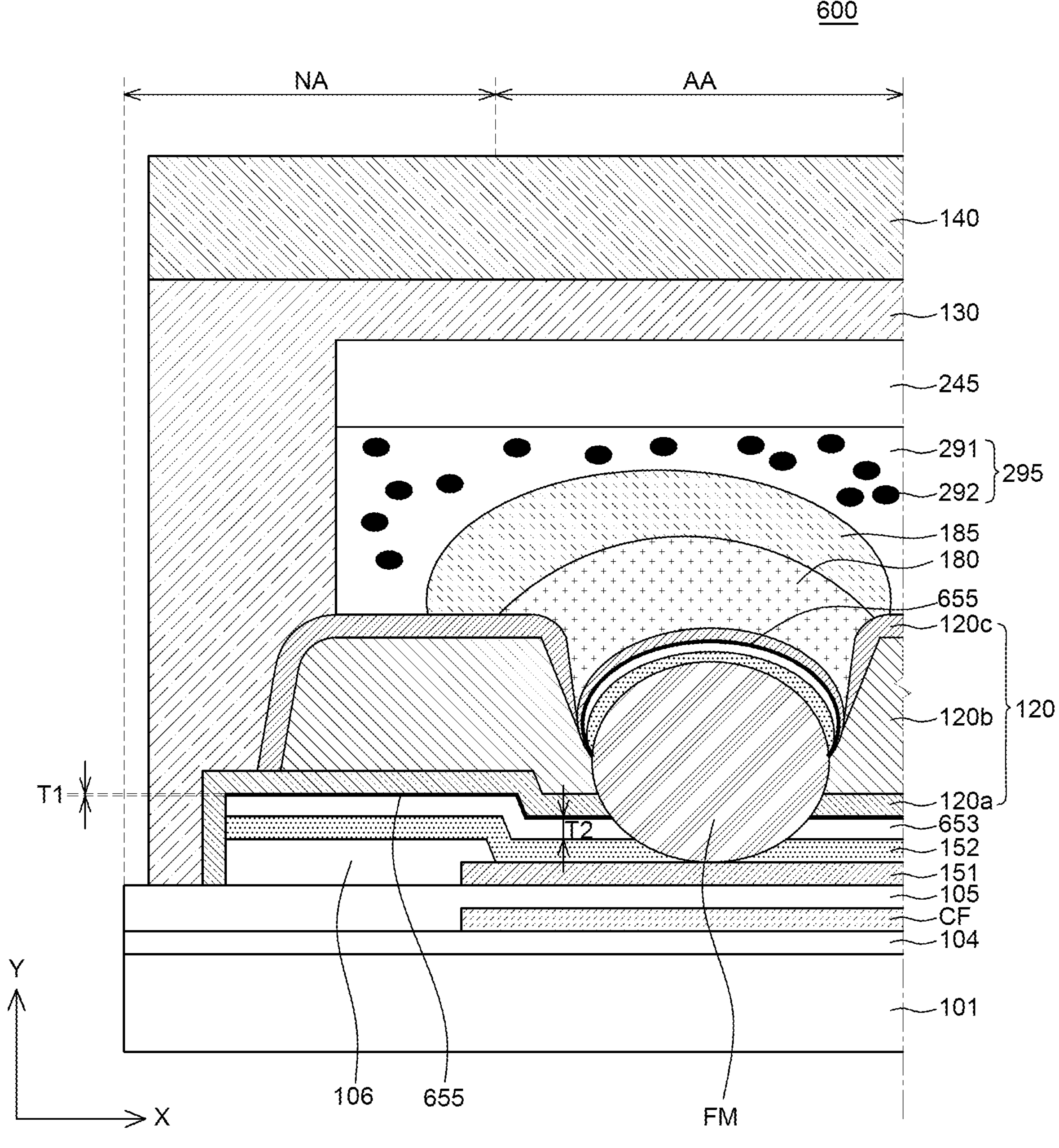
FIG. 11 is a cross-sectional view illustrating a display panel according to a sixth exemplary embodiment of the present disclosure.

FIG. 11 is a cross-sectional view illustrating a display panel according to a sixth exemplary embodiment of the present disclosure.

Since other configurations of a display panel 600 according to the sixth exemplary embodiment of the present disclosure shown in FIG. 11 are substantially identical to those of the display panel 200 of the second exemplary embodiment shown in FIGS. 5 and 6 with only a difference in that an oxide layer 655 is formed on a surface of a cathode 653, redundant descriptions thereof will be omitted.

FIG. 11 illustrates a cross-section of the display panel 600 at a portion where a foreign material FM is generated as an example. In FIG. 11, detailed illustrations of the pixel unit of the active area AA and the GIP unit of the non-active area NA are omitted for convenience of description.

Referring to FIG. 11, in the electroluminescent display device according to the sixth exemplary embodiment of the present disclosure, a driving element may be disposed on the substrate 101.

In addition, the planarization layer 105 may be disposed on the driving element.

In addition, an organic light emitting element electrically connected to the driving element may be disposed on the planarization layer 105, and the encapsulation layer 120 having multiple layers may be disposed on the organic light emitting element.

The organic light emitting element 150 may be configured by sequentially disposing the anode 151, the plurality of organic layers 152, and the cathode 653.

At this time, during a process before deposition of the organic layer 152, a foreign material FM may be generated and present on the substrate 101. In this case, the organic layer 152 and the cathode 653 are deposited on the foreign material FM.

At this time, the sixth exemplary embodiment of the present disclosure is characterized in that the oxide layer 655 of $Al_2O_3$ is formed on a surface of the cathode 653 around the foreign material FM by applying electrical stress in an oxygen ($O_2$) atmosphere containing $H_2O$.

The oxide layer 655 thus formed prevents (or insulates) short-circuit between the anode 151 and the cathode 653 and can normalize dark spots.

It was confirmed that the oxide layer 655 having a thickness of about 50 Å is formed on the surface of the cathode 653 through the aging process. In one embodiment, a thickness T1 of the oxide layer 655 is relatively thinner than a thickness T2 of the cathode 653 as shown in FIG. 11.

Meanwhile, a capping layer is formed on the upper surface of the substrate 101 on which the light emitting element is formed, and the primary passivation layer 120*a*, the organic layer 120*b*, and the secondary passivation layer 120*c* may be sequentially formed on the capping layer to constitute the encapsulation layer 120 as an encapsulation unit.

The encapsulation substrate 140 may be disposed on the entire surface of the substrate 101 including the secondary passivation layer 120*c* with the adhesive layer 130 interposed therebetween, but the present disclosure is not limited thereto, and a sealing member and a reinforcing substrate may be sequentially disposed on the encapsulation layer 120.

In addition, the sixth exemplary embodiment of the present disclosure is characterized in that the multilayered barrier layers 180 and 185 are applied to the point where the foreign material FM is generated in the same manner as in the first to fifth exemplary embodiments of the present disclosure described above.

That is, the primary barrier layer 180 may be formed on the foreign material FM.

In addition, the secondary barrier layer 185 may be formed to cover the primary barrier layer 180.

In addition, the sixth exemplary embodiment of the present disclosure is characterized in that the additional encapsulation substrate 245 is attached to cover the secondary barrier layer 185 on an upper portion of the foreign material FM, using a stamp process, in the same manner as the second to fifth exemplary embodiments of the present disclosure.

The additional encapsulation substrate 245 may be attached to the substrate 101 via the tertiary barrier layer 295 interposed therebetween.

The encapsulation substrate 140 may be disposed on the entire surface of the substrate 101 to which the additional encapsulation substrate 245 is attached, with the adhesive layer 130 interposed therebetween.

Meanwhile, as described above, the present disclosure is not limited thereto, and an encapsulation structure having a multilayer structure formed of a sealing member and a reinforcing substrate may be disposed on the entire surface of the substrate 101 to which the additional encapsulation substrate 245 is attached. This will be described in detail with reference to FIG. 12.

Figure 12:
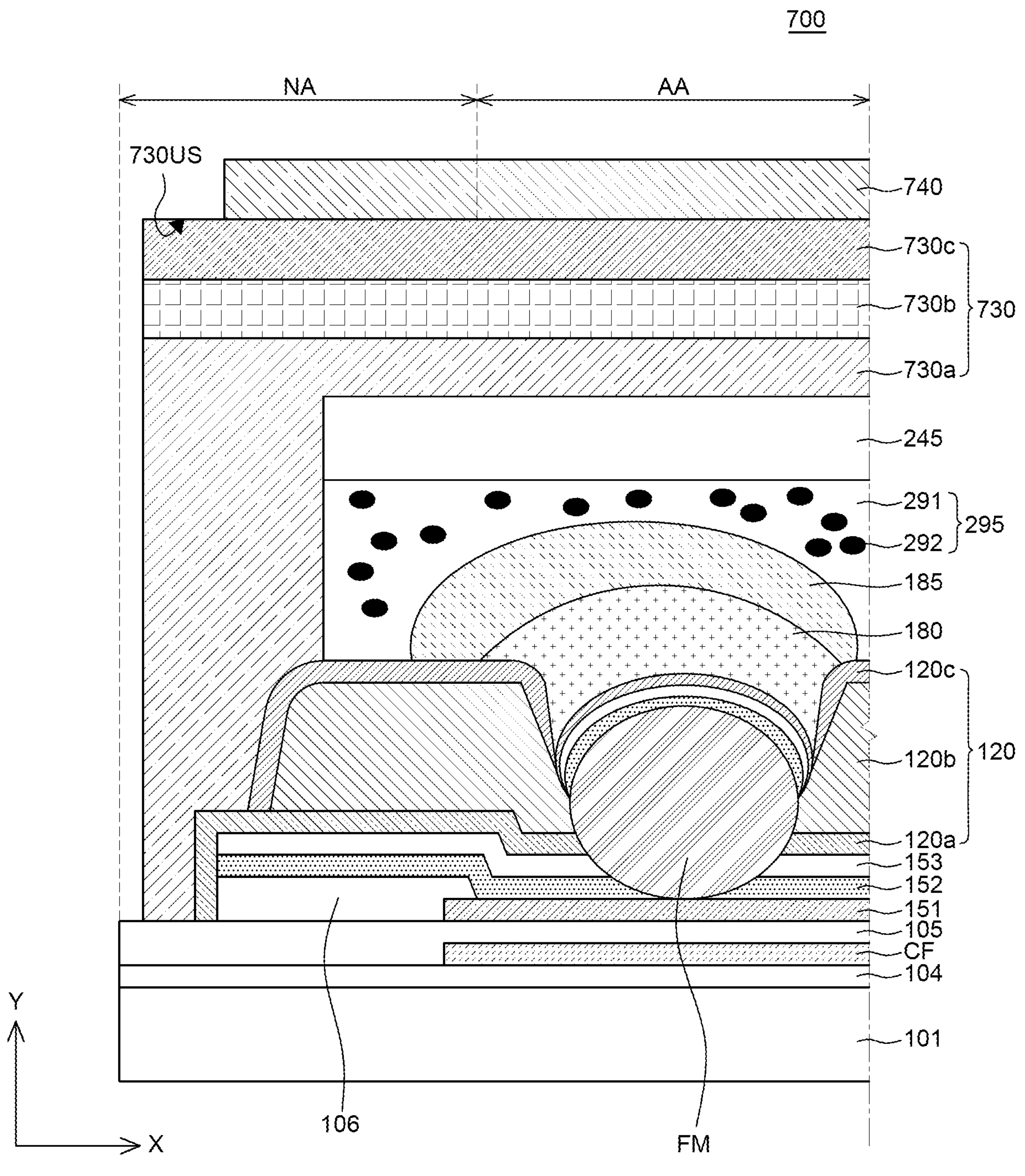
FIG. 12 is a cross-sectional view illustrating a display panel according to a seventh exemplary embodiment of the present disclosure.

FIG. 12 is a cross-sectional view illustrating a display panel according to a seventh exemplary embodiment of the present disclosure.

Since other configurations of a display panel 700 according to the seventh exemplary embodiment of FIG. 12 are substantially identical to those of the display panel 200 of the second exemplary embodiment shown in FIGS. 5 and 6 with only a difference in that a sealing member 730 and a reinforcing substrate 740 are applied in an encapsulated structure, redundant descriptions thereof will be omitted. Meanwhile, the encapsulation structure according to the seventh exemplary embodiment of the present disclosure may be applied to the display panels 100, 200, 300, 400, 500, and 600 according to the above-described first to sixth exemplary embodiments of the present disclosure.

FIG. 12 shows a cross-section of the display panel 700 where a foreign material FM is generated as an example. In FIG. 12, detailed illustrations of the pixel unit of the active area AA and the GIP unit of the non-active area NA are omitted for convenience of description.

Referring to FIG. 12, in the electroluminescent display device according to the seventh exemplary embodiment of the present disclosure, a driving element may be disposed on the substrate 101.

In addition, the planarization layer 105 may be disposed on the driving element.

In addition, an organic light emitting element electrically connected to the driving element may be disposed on the planarization layer 105, and the encapsulation layer 120 having multiple layers may be disposed on the organic light emitting element.

Meanwhile, the seventh exemplary embodiment of the present disclosure is characterized by the multilayered barrier layers 180 and 185 to a point where the foreign material FM is generated in the same manner as the first to sixth exemplary embodiments of the present disclosure described above.

That is, the primary barrier layer 180 may be formed on the foreign material FM.

In addition, the secondary barrier layer 185 may be formed to cover the primary barrier layer 180.

In addition, the seventh exemplary embodiment of the present disclosure is characterized in that the additional encapsulation substrate 245 is attached to cover the secondary barrier layer 185 on an upper portion of the foreign material FM, using a stamp process, in the same manner as the second to sixth exemplary embodiments of the present disclosure described above.

The additional encapsulation substrate 245 may be attached to the substrate 101 via the tertiary barrier layer 295 interposed therebetween.

Meanwhile, the seventh exemplary embodiment of the present disclosure is characterized in that the sealing member 730 and the reinforcing substrate 740 are sequentially disposed on the entire surface of the substrate 101 to which the additional sealing substrate 245 is attached.

Small-sized display panels used in mobile and portable devices have small areas, so heat is quickly dissipated from elements and there are few defects with adhesion, whereas large-sized display panels used in monitors, tablets, and television receivers have large areas and thus, an encapsulation structure for optimal heat dissipation and adhesion is required.

In addition, in order to secure insufficient rigidity, the electroluminescent display device may further include a separate inner plate on an upper portion of the encapsulation substrate. In this case, it is necessary to secure a space for arranging a separate inner plate, and there are limitations in slimming and reducing a weight of the electroluminescent display device due to a weight of the inner plate. In addition, a vertical separation space is generated by an air gap generated between the encapsulation substrate and the inner plate by the amount equal to a thickness of an adhesive tape disposed to bond the encapsulation substrate and the inner plate, thereby reducing heat dissipation performance.

Therefore, the seventh exemplary embodiment of the present disclosure is characterized by applying an encapsulation structure of a multilayer structure including the sealing member 730 capable of preventing process defects and fixing a relatively thick reinforcing substrate 740 while removing a separate inner plate.

At this time, the sealing member 730 may include a first adhesive layer 730*a* facing the substrate 101, a second adhesive layer 730*c* facing the reinforcing substrate 740, and a barrier layer 730*b* disposed between the first adhesive layer 730*a* and the second adhesive layer 730*c*.

In this case, each of the first adhesive layer 730*a* and the second adhesive layer 730*c* may be formed of an adhesive polymer material. For example, the first adhesive layer 730*a* may be formed of any one of olefin-based, epoxy-based, and acrylate-based polymer materials. In addition, the second adhesive layer 730*c* may be formed of any one of olefin-based, epoxy-based, acrylate-based, amine-based, phenol-based, and acid anhydride-based polymer materials that do not contain a carboxyl group. In particular, the second adhesive layer 730*c* is preferably formed of a polymer material that does not contain a carboxyl group for film uniformity and corrosion prevention of the barrier layer 730*b*.

To dissipate heat from the substrate 101, at least the first adhesive layer 730*a* among the first and second adhesive layers 730*a* and 730*c* may be formed of a mixture including particles of an adhesive polymer material and a metal material. there is. For example, the particle of the metal material may be powder formed of nickel (Ni). The first adhesive layer 730*a* in direct contact with the substrate 101 is formed of a mixture including particles of an adhesive polymer material and a metal material, and thus may have higher thermal conductivity than that of the adhesive polymer material.

Similarly, the second adhesive layer 730*c* may be formed of a mixture including particles of an adhesive polymer material and a metal material and have higher thermal conductivity than that of the adhesive polymer material.

In this manner, since a speed at which driving heat generated in the substrate 101 is dissipated through the sealing member 730 can be improved, a heat dissipation effect of the substrate 101 can be improved.

As shown in FIG. 12, the sealing member 730 has an upper surface 730 US. To be specific, the second adhesive layer 730*c* part of the sealing member 730 has an upper surface 730 US. According to one embodiment, the reinforcing substrate 740 exposes at least a portion of the upper surface 730 US of the sealing member 730.

In addition, to prevent moisture permeation to the pixel unit, the first adhesive layer 730*a* may be formed of a mixture further including an inorganic filler having moisture absorbing properties. In this case, the inorganic filler having moisture absorbing properties may be at least one of barium oxide (BaO), calcium oxide (CaO), and magnesium oxide (MgO).

Unlike the first adhesive layer 730*a*, the second adhesive layer 730*c* does not directly contact the pixel unit, and thus does not need to include an inorganic filler to prevent moisture permeation of the pixel unit. Accordingly, the second adhesive layer 730*c* may include only particles of an adhesive polymer material and a metal material without including the inorganic filler having moisture absorbing properties. In this manner, the amount of relatively expensive inorganic filler (having moisture absorbing properties) injected into the sealing member 730 can be reduced, and thus the cost of preparing the sealing member 730 can be reduced.

In addition, since a mixing ratio of the polymer material included in the second adhesive layer 730*c* may be increased compared to that of the first adhesive layer 730*a* as long as the inorganic filler having moisture absorbing properties is not included, adhesion of the second adhesive layer 730*c* can be improved as compared to that of the first adhesive layer 730*a*. Accordingly, as the reinforcement substrate 740 is more firmly fixed on the second adhesive layer 730*c*, reliability of the bonding force between the substrate 101 and the reinforcement substrate 740 can be further improved.

In addition, as the multilayer structure of the first adhesive layer 730*a* and the second adhesive layer 730*b* is formed, reliability of reducing a warpage phenomenon in which the display panel 700 is bent can also be improved.

A thickness of each of the first and second adhesive layers 730*a* and 730*c* may be limited to a critical thickness or less to prevent process defects. In addition, the sum of the thicknesses of the first and second adhesive layers 730*a* and 730*c* may be limited to a critical thickness or more for securing reliability of fixing the reinforcement substrate 740.

For example, each of the first and second adhesive layers 730*a* and 730*c* may have a thickness within a range of 10 um to 100 um.

The barrier layer 730*b* may be formed of any one of a metal material and an inorganic insulating material. That is, the barrier layer 730*b* may include a metal material such as Al, Cu, Sn, Ag, Fe, or Zn. In another example, the barrier layer 730*b* may be formed of a thin film of an inorganic insulating material such as SiOx and SiONx.

The barrier layer 730*b* may be introduced to realize a laminated structure for reinforcing adhesion with the first and second adhesive layers 730*a* and 730*c* and reducing warpage. Specifically, each of the first and second adhesive layers 730*a* and 730*c* includes an adhesive polymer material. Accordingly, the barrier layer 730*b* having a relatively hard material is disposed between the first adhesive layer 730*a* and the second adhesive layer 730*c* and thus, one side and the other side of the barrier layer 730*b* are bonded to the first adhesive layer 730*a* and the second adhesive layer 730*c*, respectively, so that bonding strength may be improved.

At this time, a thickness of the barrier layer 730*b* may be limited to a value smaller than thicknesses of the first and second adhesive layers 730*a* and 730*c* in order to reduce or minimize an increase in thickness of the sealing member 130 due to the barrier layer 730*b*. For example, the thickness of the barrier layer 730*b* may be greater than 10 μm and smaller than each of the first and second adhesive layers 730*a* and 730*c*.

In this manner, since the sealing member 730 according to the seventh exemplary embodiment of the present disclosure includes the first and second adhesive layers 730*a* and 730*c* separated by the barrier layer 730*b*, it can be implemented with a thickness twice as thick as a single-layer adhesive material without a process defect. Accordingly, since the reinforcing substrate 740 fixed by the sealing member 730 can be provided with a thick thickness, there is an advantage in that rigidity increase and heat dissipation effects can be easily realized. That is, when the thickness of the sealing member 730 is within a range of 30 um to 300 um, the thickness of the reinforcing substrate 740 may be implemented as a thickness within a range of 0.1 mm to 1.5 mm.

For example, the reinforcing substrate 740 may be formed of any one material among glass, metal, and plastic polymer. For example, the reinforcing substrate 740 may be formed of a metal material including Al, Cu, Sn, Ag, Fe, or Zn.

The exemplary embodiments of the present disclosure can also be described as follows:

According to an aspect of the present disclosure, there is provided an electroluminescent display device. The electroluminescent display device comprises an anode over a substrate, an organic layer on the anode, a cathode on the organic layer, an encapsulation layer over the cathode, a foreign material present between the anode and the organic layer, the cathode, and the encapsulation layer and a barrier layer over the encapsulation layer to cover the foreign material.

The foreign material may be disposed on the anode, and the organic layer, the cathode, and the encapsulation layer may be disposed on the foreign material.

The foreign material may pass through the organic layer, the cathode, and the encapsulation layer.

The encapsulation layer may include a primary passivation layer, an organic layer on the first passivation layer and a second passivation layer on the organic layer.

A void may be generated in the organic layer around the foreign material, and a seam may be generated in the secondary passivation layer around the foreign material.

The barrier layer may be disposed on the foreign material to fill the void of the organic layer.

The barrier layer may include a first barrier layer on the foreign material and a second barrier layer on the first barrier layer.

The first barrier layer may be made of a UV curable resin.

The first barrier layer may be made of acrylated epoxy, acryl, epoxy, acrylated polymer, acrylated urethane or acrylated silicon.

The second barrier layer may be disposed to cover the first barrier layer and may be made of epoxy or polyvinyl alcohol resin and a filler.

The filler may include talc.

The electroluminescent display device may further include an encapsulation substrate over the barrier layer with an adhesive layer interposed therebetween.

The electroluminescent display device may further include an additional encapsulation substrate over the second barrier layer, the adhesive layer may be disposed on the additional encapsulation substrate.

The additional encapsulation substrate may have a larger area than the second barrier layer and may completely cover the second barrier layer.

The encapsulation substrate and the additional encapsulation substrate may be made of a thin metal layer of aluminum foil (Al foil).

The electroluminescent display device may further include a tertiary barrier layer interposed between the additional encapsulation substrate and the second barrier layer, the tertiary barrier layer may be made of a resin having adhesive properties and getters dispersed in the resin.

The electroluminescent display device may further include an additional adhesive layer disposed under the tertiary barrier layer.

The electroluminescent display device may further include an auxiliary substrate over the encapsulation substrate.

The auxiliary substrate may be spaced apart from an end portion of the encapsulation substrate by a selected distance so that a portion of the end portion of the encapsulation substrate is exposed, and a conductive tape may be attached to the exposed end portion of the encapsulation substrate.

The conductive tape may be attached to onto the auxiliary substrate so as to cover portions of a side surface and an upper surface of the auxiliary substrate from the exposed end portion of the encapsulation substrate.

A contact hole may be formed in a partial region of the auxiliary substrate to expose a portion of an upper surface of the encapsulation substrate, and a conductive paste that is injected to fill the contact hole may be disposed on the exposed upper surface of the encapsulation substrate.

An oxide layer of $Al_2O_3$ may be disposed on a surface of the cathode around the foreign material.

The oxide layer may insulate the anode and the cathode around the foreign material.

The electroluminescent display device may further include a reinforcing substrate and a sealing member having a multilayer structure, disposed on the secondary barrier layer.

The sealing member may include a first adhesive layer on the second barrier layer and facing the substrate, a second adhesive layer facing the reinforcing substrate and a barrier layer between the first adhesive layer and the second adhesive layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts described in the present disclosure and its equivalents should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescent display device, comprising:
- an anode over a substrate;
- an organic layer on the anode;
- a cathode on the organic layer;
- an encapsulation layer over the cathode;
- a foreign material present between the anode and any one of the organic layer, the cathode, and the encapsulation layer; and
- a barrier layer over the encapsulation layer to cover the foreign material.

2. The electroluminescent display device of claim 1, wherein:
- the foreign material is disposed on the anode; and
- the organic layer, the cathode, and the encapsulation layer are disposed on the foreign material.

3. The electroluminescent display device of claim 2, wherein the foreign material passes through the organic layer, the cathode, and the encapsulation layer.

4. The electroluminescent display device of claim 1, wherein the encapsulation layer includes:
- a primary passivation layer;
- an organic layer of the encapsulation layer on the primary passivation layer; and
- a second passivation layer on the organic layer.

5. The electroluminescent display device of claim 4, wherein:
- a void is generated in the organic layer around the foreign material; and
- a seam is generated in the secondary passivation layer around the foreign material.

6. The electroluminescent display device of claim 5, wherein the barrier layer is disposed on the foreign material to fill the void of the organic layer.

7. The electroluminescent display device of claim 1, wherein the barrier layer includes,
- a first barrier layer on the foreign material; and
- a second barrier layer on the first barrier layer.

8. The electroluminescent display device of claim 7, wherein the first barrier layer is made of a UV curable resin.

9. The electroluminescent display device of claim 7, wherein the first barrier layer is made of acrylated epoxy, acryl, epoxy, acrylated polymer, acrylated urethane or acrylated silicon.

10. The electroluminescent display device of claim 7, wherein the second barrier layer is disposed to cover the first barrier layer and is made of epoxy or polyvinyl alcohol resin and a filler.

11. The electroluminescent display device of claim 10, wherein the filler includes talc.

12. The electroluminescent display device of claim 7, further comprising:
- an encapsulation substrate over the barrier layer with an adhesive layer interposed therebetween.

13. The electroluminescent display device of claim 12, further comprising:
- an additional encapsulation substrate over the second barrier layer,
- wherein the adhesive layer is disposed on the additional encapsulation substrate.

14. The electroluminescent display device of claim 13, wherein the additional encapsulation substrate has a larger area than the second barrier layer and completely covers the second barrier layer.

15. The electroluminescent display device of claim 13, wherein the encapsulation substrate and the additional encapsulation substrate are made of a thin metal layer of aluminum foil.

16. The electroluminescent display device of claim 13, further comprising:
- a tertiary barrier layer interposed between the additional encapsulation substrate and the second barrier layer,
- wherein the tertiary barrier layer is made of a resin having adhesive properties and getters dispersed in the resin.

17. The electroluminescent display device of claim 16, further comprising:
- an additional adhesive layer disposed under the tertiary barrier layer.

18. The electroluminescent display device of claim 12, further comprising:
- an auxiliary substrate over the encapsulation substrate.

19. The electroluminescent display device of claim 18, wherein:
- the auxiliary substrate is spaced apart from an end portion of the encapsulation substrate by a selected distance so that a portion of the end portion of the encapsulation substrate is exposed; and
- a conductive tape is attached to the exposed end portion of the encapsulation substrate.

20. The electroluminescent display device of claim 19, wherein the conductive tape is attached to onto the auxiliary substrate so as to cover portions of a side surface and an upper surface of the auxiliary substrate from the exposed end portion of the encapsulation substrate.

21. The electroluminescent display device of claim 18, wherein:
- a contact hole is formed in a partial region of the auxiliary substrate to expose a portion of an upper surface of the encapsulation substrate; and
- a conductive paste that is injected to fill the contact hole is disposed on the exposed upper surface of the encapsulation substrate.

22. The electroluminescent display device of claim 7, further comprising:
- a reinforcing substrate and a sealing member having a multilayer structure, disposed on the secondary barrier layer.

23. The electroluminescent display device of claim 22, wherein the sealing member includes:
- a first adhesive layer on the second barrier layer and facing the substrate;
- a second adhesive layer facing the reinforcing substrate; and
- a barrier layer between the first adhesive layer and the second adhesive layer.

24. The electroluminescent display device of claim 1, wherein an oxide layer of $Al_2O_3$ is disposed on a surface of the cathode around the foreign material.

25. The electroluminescent display device of claim 24, wherein the oxide layer insulates the anode and the cathode around the foreign material.

26. An electroluminescent display device, comprising:

an anode over a substrate;

an organic layer on the anode;

a cathode on the organic layer;

an encapsulation layer on the cathode; and a primary barrier layer on the encapsulation layer, wherein the primary barrier layer is on a foreign material present between the substrate and the encapsulation layer, wherein the foreign material has a first dimension in a first direction, wherein the primary barrier layer has a second dimension in the first direction, and wherein the second dimension of the primary barrier layer is greater than the first dimension of the foreign material to sufficiently cover the foreign material.

27. The electroluminescent display device of claim 26, comprising:

a secondary barrier layer on the primary barrier layer, wherein the secondary barrier layer has a third dimension in the first direction, and wherein the third dimension of the secondary barrier layer is greater than the second dimension of the primary barrier layer to sufficiently cover the primary barrier layer.

28. The electroluminescent display device of claim 27, comprising:

a tertiary barrier layer on the secondary barrier layer, wherein the tertiary barrier layer has a fourth dimension in the first direction, and wherein the fourth dimension of the tertiary barrier layer is greater than third dimension of the secondary barrier layer to sufficiently cover the secondary barrier layer.

29. The electroluminescent display device of claim 28, wherein the tertiary barrier layer includes a resin and getters dispersed within the resin.

30. The electroluminescent display device of claim 28, comprising:

a first encapsulation substrate on the tertiary barrier layer, wherein the first encapsulation substrate has a fifth dimension in the first direction, wherein the fifth dimension of the first encapsulation substrate is equal to or greater than the fourth dimension of the tertiary barrier layer.

31. The electroluminescent display device of claim 28, comprising:

a first adhesive layer between the encapsulation layer and the tertiary barrier layer, wherein the first adhesive layer contacts the secondary barrier layer.

32. The electroluminescent display device of claim 26, comprising:

an auxiliary substrate on the primary barrier layer, the auxiliary substrate having an upper surface and a side surface extending from the upper surface; and a conductive tape on the auxiliary substrate;

wherein the conductive tape at least partially covers the upper surface of the auxiliary substrate and fully covers the side surface of the auxiliary substrate.

33. The electroluminescent display device of claim 26, comprising:

an auxiliary substrate on the primary barrier layer, the auxiliary substrate having an upper surface;

a contact hole in the auxiliary substrate, the contact hole extending from the upper surface and extending through the auxiliary substrate; and a conductive paste on the auxiliary substrate and the contact hole, wherein the conductive paste protrudes above the upper surface of the auxiliary substrate.

34. The electroluminescent display device of claim 26, comprising:

an oxide layer between the cathode and the encapsulation layer, wherein a thickness of the oxide layer is relatively thinner than a thickness of the cathode.

35. The electroluminescent display device of claim 26, wherein the oxide layer, in operation, insulates short-circuit between the anode and the cathode caused by the presence of the foreign material.

36. The electroluminescent display device of claim 26, comprising:

a sealing member on the encapsulation layer, the sealing member having an upper surface; and a reinforcing substrate on the encapsulation layer, the reinforcing substrate exposing at least a portion of the upper surface of the sealing member.

37. The electroluminescent display device of claim 36, wherein the sealing member includes:

a first adhesive layer facing the substrate;

a second adhesive layer facing the reinforcing substrate; and a barrier layer between the first adhesive layer and the second adhesive layer.

* * * * *